(12) United States Patent
Himeno et al.

(10) Patent No.: US 12,426,279 B2
(45) Date of Patent: Sep. 23, 2025

(54) NON-VOLATILE STORAGE DEVICE AND METHOD OF MANUFACTURING THE SAME

(71) Applicant: Nuvoton Technology Corporation Japan, Kyoto (JP)

(72) Inventors: Atsushi Himeno, Osaka (JP); Yukio Hayakawa, Kyoto (JP); Koichi Kawashima, Kyoto (JP); Ryutaro Yasuhara, Hyogo (JP)

(73) Assignee: NUVOTON TECHNOLOGY CORPORATION JAPAN, Kyoto (JP)

(*) Notice: Subject to any disclaimer, the term of this patent is extended or adjusted under 35 U.S.C. 154(b) by 732 days.

(21) Appl. No.: 17/459,321

(22) Filed: Aug. 27, 2021

(65) Prior Publication Data
US 2021/0408119 A1   Dec. 30, 2021

Related U.S. Application Data

(63) Continuation of application No. PCT/JP2019/050457, filed on Dec. 24, 2019.

(30) Foreign Application Priority Data

Mar. 4, 2019   (JP) .................................. 2019-038276

(51) Int. Cl.
 *H10B 63/00* (2023.01)
 *H10N 70/00* (2023.01)
 *H10N 70/20* (2023.01)
(52) U.S. Cl.
 CPC .......... *H10B 63/80* (2023.02); *H10N 70/011* (2023.02); *H10N 70/24* (2023.02)

(58) Field of Classification Search
 CPC ...... H10B 63/80; H10N 70/011; H10N 70/24; H10N 70/826
 See application file for complete search history.

(56) References Cited

U.S. PATENT DOCUMENTS 9,893,278 B1    2/2018 Chuang et al.
2009/0283736 A1  11/2009 Kanzawa et al.
(Continued)

FOREIGN PATENT DOCUMENTS

JP   2010-177624 A   8/2010
JP   2015-146343 A   8/2015
(Continued)

OTHER PUBLICATIONS

International Search Report and Written Opinion issued on Mar. 10, 2020 in International Patent Application No. PCT/JP2019/050457; with partial English translation.
(Continued)

*Primary Examiner* — Tucker J Wright
(74) *Attorney, Agent, or Firm* — Rimon P.C.

(57) ABSTRACT

In a non-volatile storage device, a first lower-layer metal wire, a lower plug, a variable resistance element, an upper plug, and a first upper-layer metal wire are formed in that order from below in a storage region, and a second lower-layer metal wire, a first via, a middle-layer metal wire, a second via, and a second upper-layer metal wire are formed in that order from below in a circuit region. The first and second lower-layer metal wires are formed in the same layer, and the first and second upper-layer metal wires are formed on the same layer. Relative to a substrate, the variable resistance element and the middle-layer metal wire have top faces at different heights, bottom faces at different heights, or both top faces and bottom faces at different heights.

12 Claims, 22 Drawing Sheets

(56) References Cited

U.S. PATENT DOCUMENTS

| | | | |
|---|---|---|---|
| 2010/0193850 A1 | 8/2010 | Asao et al. | |
| 2012/0300543 A1* | 11/2012 | Ohno | H10N 50/10 365/171 |
| 2013/0112935 A1 | 5/2013 | Himeno et al. | |
| 2017/0117467 A1* | 4/2017 | Chang | H10N 70/063 |
| 2017/0317143 A1 | 11/2017 | Chen et al. | |

FOREIGN PATENT DOCUMENTS

| | | |
|---|---|---|
| WO | 2008/149484 A1 | 12/2008 |
| WO | 2012/073503 A1 | 6/2012 |

OTHER PUBLICATIONS

Akira Usami, et al. "Semiconductor Engineering for Integrated Circuits", Kougyou Chousakai, pp. 47-48, 1992 with partial English translation.

* cited by examiner

NON-VOLATILE STORAGE DEVICE AND METHOD OF MANUFACTURING THE SAME

CROSS REFERENCE TO RELATED APPLICATIONS

This is a continuation application of PCT International Application No. PCT/JP2019/050457 filed on Dec. 24, 2019, designating the United States of America, which is based on and claims priority of Japanese Patent Application No. 2019-038276 filed on Mar. 4, 2019. The entire disclosures of the above-identified applications, including the specifications, drawings and claims are incorporated herein by reference in their entirety.

FIELD

The present disclosure relates to a non-volatile storage device and a method of manufacturing the same. In particular, the present disclosure relates to a non-volatile storage device that stores data using a material in which a resistance value changes reversibly upon application of an electrical pulse, and to a method of manufacturing the non-volatile storage device.

BACKGROUND

Recent advancements in mobile, cloud, IoT, big data, and artificial intelligence technologies have led to the constant generation of large amounts of data. To store such large amounts of data, it is necessary for memory technologies to evolve more than ever before. The advancement of such digital technologies has led to drastic increases in the miniaturization and speed of the semiconductor elements used.

Among such technologies, the applications of large-capacity non-volatile memory, typified by Flash memory, are expanding rapidly. Recently, research and development is progressing in the area of variable-resistance non-volatile storage devices, which use what are known as variable resistance elements, as a new type of next-generation non-volatile memory which replaces Flash memory. A "variable resistance element" is an element having a property where the resistance value changes reversibly in response to an electrical signal, and which can store, in a non-volatile manner, information corresponding to the resistance value.

PTL 1 discloses a non-volatile storage element in which a variable resistance layer includes a first region and a second region in a thickness direction, the first region including a first oxygen-deficient tantalum oxide having a composition represented by $TaO_x$ (where $0<x<2.5$), and the second region including a second oxygen-deficient tantalum oxide having a composition represented by $TaO_y$ (where $x<y<2.5$).

Furthermore, PTL 2 discloses a non-volatile storage device including a variable resistance element between metal wire layers. By covering side faces of the variable resistance element with a side wall protection layer, the non-volatile storage device can prevent both the oxidization of side face parts of the variable resistance element produced by deposition and heat treatment processes of inter-layer insulating layers after forming the variable resistance element, and the unintended formation of a leak path between the variable resistance element and metal wire in an upper layer.

FIG. 7 is a cross-sectional view illustrating an example of the overall configuration of a past non-volatile storage device 400 disclosed in PTL 2. Non-volatile storage device 400 illustrated in FIG. 7 has a configuration in which the constituent elements described hereinafter are formed in first inter-layer insulating layer 11, second inter-layer insulating layer 12, and third inter-layer insulating layer 13 of storage region 60 and circuit region 70, which are provided above substrate 10.

Variable resistance element 40 is formed in storage region 60. Variable resistance element 40 is formed between first lower-layer metal wire 20 and first upper-layer metal wire 23, and includes lower electrode 41, variable resistance layer 42, and upper electrode 43. Side wall protection layer 50 is formed on side faces of variable resistance element 40. Additionally, lower electrode 41 of variable resistance element 40 is connected to first lower-layer metal wire 20 by lower plug 30, and upper electrode 43 is connected directly to first upper-layer metal wire 23.

On the other hand, second lower-layer metal wire 21, and second upper-layer metal wire 24 connected to second lower-layer metal wire 21 by first via 31, are formed in circuit region 70.

CITATION LIST

Patent Literature

PTL 1: International Publication No. 2008/149484
PTL 2: International Publication No. 2012/073503

SUMMARY

Technical Problem

On the other hand, with the miniaturization of LSI circuits in recent years, it has become necessary to reduce the thickness of the metal wire, the insulation films between wire layers, and the like, and there is now a need to make the thickness of the insulation film between the wire layers of the lower-layer metal wire and the upper-layer metal wire lower than the thickness of the past variable resistance element plus the thickness of the lower plug.

However, reducing the thickness of the variable resistance element, the lower plug, or the like to accommodate miniaturization has a major effect on the operating characteristics of the non-volatile storage device.

Having been conceived in light of the above-described circumstances, the present disclosure provides a non-volatile storage device that includes a variable resistance element between metal wire layers in a miniature LSI circuit without affecting operating characteristics of the non-volatile storage device, and provides a method of manufacturing the non-volatile storage device.

Solution to Problem

One aspect of a non-volatile storage device according to the present disclosure is a non-volatile storage device including a storage region formed above a substrate and a circuit region in a periphery of the storage region. The non-volatile storage device includes: a first lower-layer metal wire, a lower plug connected to the first lower-layer metal wire, a variable resistance element connected to the lower plug, and a first upper-layer metal wire electrically connected to the variable resistance element, formed in stated order from below in the storage region; and a second lower-layer metal wire, a first via connected to the second lower-layer metal wire, a middle-layer metal wire connected to the first via, a second via connected to the middle-layer metal wire, and a second upper-layer metal wire connected to the second via, formed in stated order from below in the circuit region. The first lower-layer metal wire and the second lower-layer metal wire are formed in a same layer, the first upper-layer metal wire and the second upper-layer metal wire are formed in a same layer, and at least one of top faces of the variable resistance element and the middle-layer metal wire or bottom faces of the variable resistance element and the middle-layer metal wire are located at different heights with respect to a surface of the substrate.

Additionally, one aspect of a method of manufacturing a non-volatile storage device according to the present disclosure is a method of manufacturing a non-volatile storage device including a storage region formed above a substrate and a circuit region in a periphery of the storage region. The method includes: forming a first lower-layer metal wire, a lower plug connected to the first lower-layer metal wire, a variable resistance element connected to the lower plug, and a first upper-layer metal wire electrically connected to the variable resistance element in stated order from below in the storage region; and forming a second lower-layer metal wire, a first via connected to the second lower-layer metal wire, a middle-layer metal wire connected to the first via, a second via connected to the middle-layer metal wire, and a second upper-layer metal wire connected to the second via in stated order from below in the circuit region. The first lower-layer metal wire and the second lower-layer metal wire are formed in a same layer, and the first upper-layer metal wire and the second upper-layer metal wire are formed in a same layer. A top face of the variable resistance element and a top face of the middle-layer metal wire are located at different heights with respect to a surface of the substrate, or a bottom face of the variable resistance element and a bottom face of the middle-layer metal wire are located at different heights with respect to the surface of the substrate, or the top face of the variable resistance element and the top face of the middle-layer metal wire are located at different heights with respect to the surface of the substrate and the bottom face of the variable resistance element and the bottom face of the middle-layer metal wire are located at different heights with respect to the surface of the substrate.

Advantageous Effects

According to the present disclosure, a non-volatile storage device that includes a variable resistance element between metal wire layers in a miniature LSI circuit without affecting operating characteristics of the non-volatile storage device, as well as a method of manufacturing the non-volatile storage device, can be realized.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Figure 1:
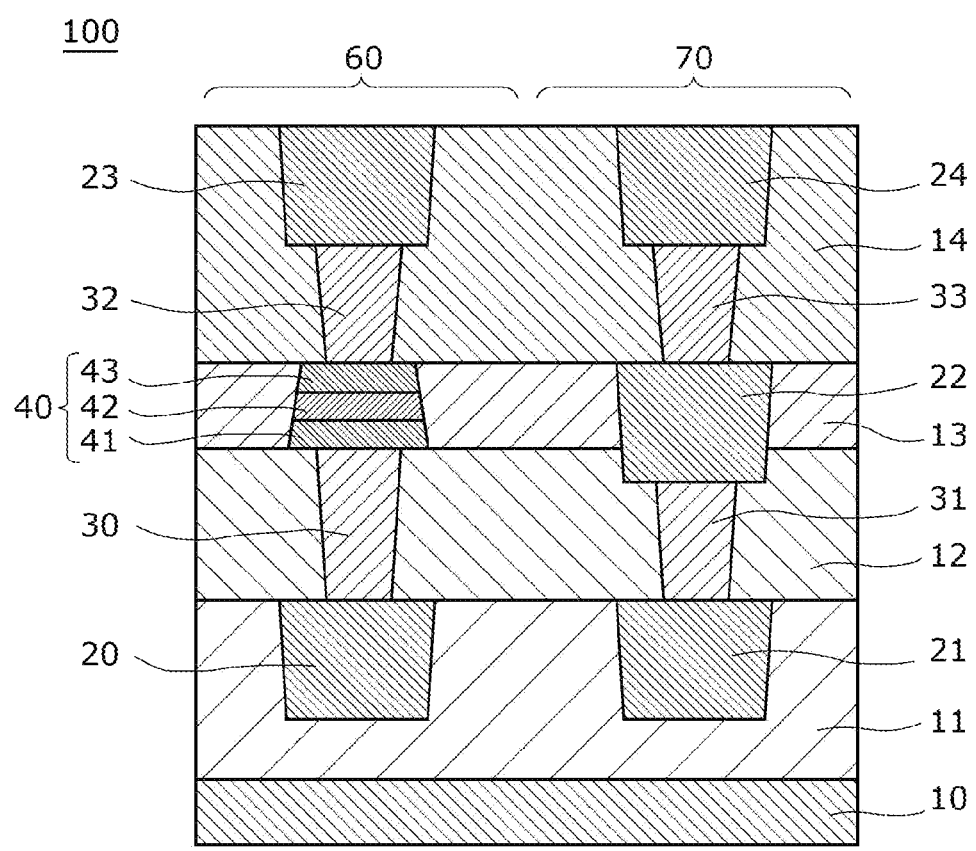
FIG. 1 is a cross-sectional view illustrating an example of the overall configuration of a non-volatile storage device according to Embodiment 1.

Further benefits and/or advantages of embodiments of the present disclosure will become apparent from the specification and the drawings. Here, the benefits and/or advantages may be provided separately by the various embodiments and features disclosed in the specification and drawings, and not all are necessary to achieve one or more of the benefits and/or advantages.

In the embodiments of the present disclosure, "oxygen deficiency" refers to the percentage of oxygen that is deficient in each metal oxide, relative to the amount of oxygen constituting the oxide having that stoichiometric composition (if there are multiple stoichiometric compositions, the stoichiometric composition having the highest resistance value). In other words, a metal oxide of a stoichiometric composition is more stable and has a higher resistance value that metal oxides of other compositions.

For example, when the metal is tantalum (Ta), the composition of the stoichiometric oxide according to the above definition is $Ta_2O_5$, and can therefore be expressed as $TaO_{2.5}$. The oxygen deficiency of $TaO_{2.5}$ is 0%.

As one example, an oxygen-deficient tantalum oxide having a composition of $TaO_{1.5}$ has an oxygen deficiency of $(2.5-1.5)/2.5=40\%$. For oxygen-rich metal oxides, the oxygen deficiency has a negative value. Unless specified otherwise, the present specification will describe the oxygen deficiency as including any of a positive value, 0, or a negative value.

Based on the foregoing, an oxide having low oxygen deficiency is close to an oxide of a stoichiometric composition, and therefore has a high resistance value. Conversely, an oxide having high oxygen deficiency is closer to the metal constituting the oxide, and therefore has a low resistance value. In other words, using an oxygen-deficient type makes the metal oxide conductive.

Additionally, in the embodiments of the present disclosure, "oxygen content" is indicated by a ratio of the number of oxygen atoms contained to the total number of atoms constituting the metal oxide. For example, the oxygen content of $Ta_2O_5$ is the ratio of the number of oxygen atoms to the total number of atoms, i.e., (O/(Ta+O)), which is 71.4 atm %. Therefore, an oxygen-deficient tantalum oxide has an oxygen content greater than 0 and less than 71.4 atm %.

When the metal constituting a first metal oxide and a metal constituting a second metal oxide are the same type, the oxygen content has a correspondence relationship with the oxygen deficiency. In other words, when the oxygen content of the second metal oxide is higher than the oxygen content of the first metal oxide, the oxygen deficiency of the second metal oxide is lower than the oxygen deficiency of the first metal oxide.

In this case, a magnitude relationship between the oxygen deficiencies can be rephrased in terms of the oxygen contents. For example, when the oxygen content of the second metal oxide is higher than the oxygen content of the first metal oxide, the oxygen deficiency of the second metal oxide is lower than the oxygen deficiency of the first metal oxide.

Additionally, in the embodiments of the present disclosure, "insulator" follows a general definition. In other words, "insulator" refers to an item constituted by a material having a resistivity of at least $10^8$ Ωcm (Non-Patent Document: "Semiconductor Engineering for Integrated Circuits", Kogyo Chosakai (1992), Akira Usami, Shinji Kanefusa, Takao Maekawa, Hajime Tomokage, Morio Inoue). In contrast, "conductor" refers to a material having a resistivity of less than $10^8$ Ωcm.

Prior to initial breakdown operations being executed for the variable resistance element, the resistivities of the first metal oxide and the second metal oxide are different by at least four to six orders of magnitude. The resistivity of the variable resistance element after the initial breakdown operations are executed is, for example, approximately $10^4$ Ωcm.

"Standard electrode potential" is generally one indicator of the ease of oxidization, with a higher value indicating more difficult oxidization and a lower value indicating easier oxidization.

Note that as a difference in standard electrode potential between an electrode and a low oxygen deficiency layer (a second variable resistance layer) having a low oxygen deficiency increases, it becomes easier for a redox reaction to occur and the resistance to change. Furthermore, as the difference between standard electrode potentials decreases, it is more difficult for a redox reaction to occur and thus more difficult for the resistance to change, which suggests that the ease of oxidation may play a major role in the mechanism of the variable resistance phenomenon.

Aspects of the Disclosure

The inventors of the present disclosure discovered that the non-volatile storage device described above in the Background section has the following problems.

Figure 7:
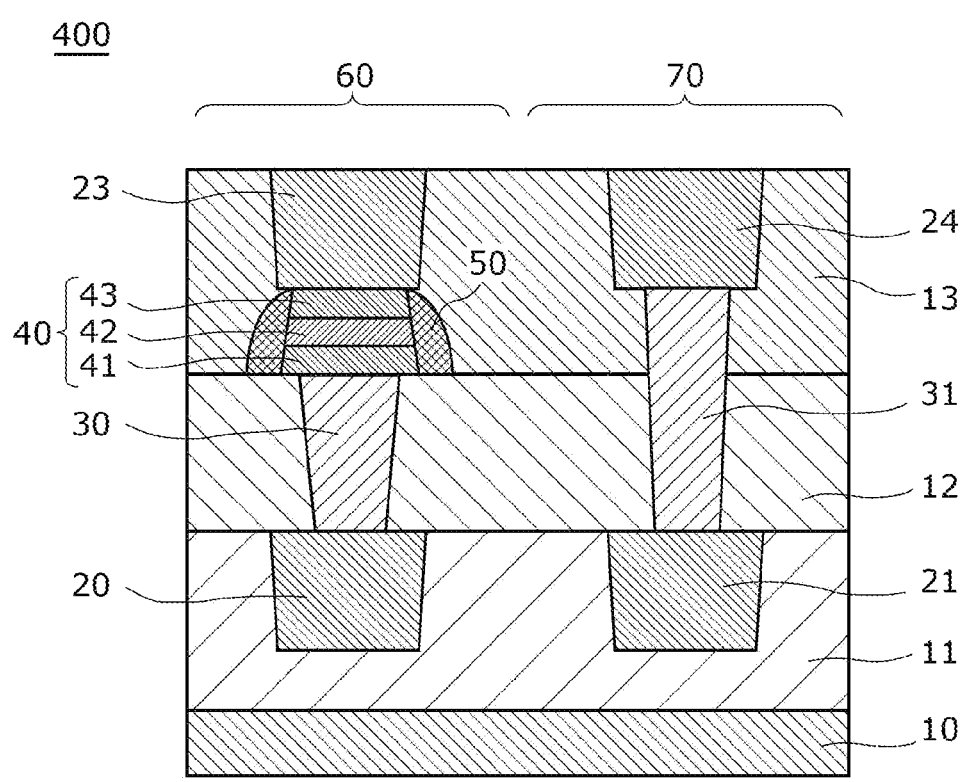
FIG. 7 is a cross-sectional view illustrating an example of the overall configuration of a past non-volatile storage device.

As described above, in non-volatile storage devices, it is now necessary to make the thickness of the insulation film between the wire layers of the lower-layer metal wire and the upper-layer metal wire lower than the thickness of the past variable resistance element plus the thickness of the lower plug. To meet this requirement, for example, in the case of the past non-volatile storage device 400 illustrated in FIG. 7, it is necessary to reduce the thickness of the variable resistance element itself, the thickness of the lower plug, and the like.

However, reducing the thickness of a lower electrode, a variable resistance layer, and an upper electrode that constitute the variable resistance element results in an issue in that the device characteristics of the variable resistance element are greatly affected.

Meanwhile, assuming a case where the lower plug is omitted and the variable resistance element is formed directly on the lower-layer metal wire, process damage, such as corrosion of the lower-layer metal wire, is an issue during a dry etching process and the like performed when patterning the variable resistance element.

Furthermore, changing the thickness of the metal wire, the insulation film between the wire layers, and the like, which are used in processes for mass-producing miniature LSI circuits, causes changes in parameters such as the wire resistance, wire capacitance, and the like. This causes an issue in that the circuit operations themselves of the LSI circuit are greatly affected.

To solve at least one of such issues, a non-volatile storage device and a method of manufacturing the same according to one aspect of the present disclosure have the following features.

One aspect of a non-volatile storage device according to the present disclosure is a non-volatile storage device including a storage region formed above a substrate and a circuit region in a periphery of the storage region. The non-volatile storage device includes: a first lower-layer metal wire, a lower plug connected to the first lower-layer metal wire, a variable resistance element connected to the lower plug, and a first upper-layer metal wire electrically connected to the variable resistance element, formed in stated order from below in the storage region; and a second lower-layer metal wire, a first via connected to the second lower-layer metal wire, a middle-layer metal wire connected to the first via, a second via connected to the middle-layer metal wire, and a second upper-layer metal wire connected to the second via, formed in stated order from below in the circuit region. The first lower-layer metal wire and the second lower-layer metal wire are formed in a same layer, the first upper-layer metal wire and the second upper-layer metal wire are formed in a same layer, and at least one of top faces of the variable resistance element and the middle-layer metal wire or bottom faces of the variable resistance element and the middle-layer metal wire are located at different heights with respect to a surface of the substrate.

Additionally, in one aspect of the non-volatile storage device according to the present disclosure, the variable resistance element and the middle-layer metal wire may be formed in a same inter-layer insulation film, and the top face of the variable resistance element and the top face of the middle-layer metal wire may be in a same plane.

Additionally, in one aspect of the non-volatile storage device according to the present disclosure, the variable resistance element and the middle-layer metal wire may be formed in a same inter-layer insulation film, and the top face of the variable resistance element and the top face of the middle-layer metal wire may be not in a same plane.

Additionally, in one aspect of the non-volatile storage device according to the present disclosure, the top face of the variable resistance element may be lower than the top face of the middle-layer metal wire with respect to the surface of the substrate.

Additionally, in one aspect of the non-volatile storage device according to the present disclosure, the bottom face of the variable resistance element may be higher than the top face of the middle-layer metal wire with respect to the surface of the substrate.

Additionally, in one aspect of the non-volatile storage device according to the present disclosure, the top face of the variable resistance element may be higher than the top face of the middle-layer metal wire with respect to the surface of the substrate.

Additionally, in one aspect of the non-volatile storage device according to the present disclosure, the top face of the variable resistance element may be in direct contact with the first upper-layer metal wire.

Additionally, one aspect of a method of manufacturing a non-volatile storage device according to the present disclosure is a method of manufacturing a non-volatile storage device including a storage region formed above a substrate and a circuit region in a periphery of the storage region. The method includes: forming a first lower-layer metal wire, a lower plug connected to the first lower-layer metal wire, a variable resistance element connected to the lower plug, and a first upper-layer metal wire electrically connected to the variable resistance element in stated order from below in the storage region; and forming a second lower-layer metal wire, a first via connected to the second lower-layer metal wire, a middle-layer metal wire connected to the first via, a second via connected to the middle-layer metal wire, and a second upper-layer metal wire connected to the second via in stated order from below in the circuit region. The first lower-layer metal wire and the second lower-layer metal wire are formed in a same layer, and the first upper-layer metal wire and the second upper-layer metal wire are formed in a same layer. A top face of the variable resistance element and a top face of the middle-layer metal wire are located at different heights with respect to a surface of the substrate, or a bottom face of the variable resistance element and a bottom face of the middle-layer metal wire are located at different heights with respect to the surface of the substrate, or the top face of the variable resistance element and the top face of the middle-layer metal wire are located at different heights with respect to the surface of the substrate and the bottom face of the variable resistance element and the bottom face of the middle-layer metal wire are located at different heights with respect to the surface of the substrate.

Additionally, one aspect of the method of manufacturing a non-volatile storage device according to the present disclosure may further include: forming a first inter-layer insulating layer above the substrate; concurrently forming the first lower-layer metal wire within the first inter-layer insulating layer in the storage region and the second lower-layer metal wire within the first inter-layer insulating layer in the circuit region; forming a second inter-layer insulating layer above first inter-layer insulating layer including the first lower-layer metal wire and the second lower-layer metal wire; forming a lower plug within the second inter-layer insulating layer in the storage region, the lower plug being connected to the first lower-layer metal wire; forming the variable resistance element in the storage region above the second inter-layer insulating layer including the lower plug, the variable resistance element being connected to the lower plug; forming a third inter-layer insulating layer above the second inter-layer insulating layer including the variable resistance element; forming the first via and the middle-layer metal wire within the second inter-layer insulating layer and the third inter-layer insulating layer in the circuit region, the first via being connected to the second lower-layer metal wire and the middle-layer metal wire being connected to the first via; forming a fourth inter-layer insulating layer above the third inter-layer insulating layer including the variable resistance element and the middle-layer metal wire; and concurrently forming an upper plug and the first upper-layer metal wire within the fourth inter-layer insulating layer in the storage region, the upper plug being connected to the variable resistance element and the first upper-layer metal wire being connected to the upper plug, and the second via and the second upper-layer metal wire within the fourth inter-layer insulating layer in the circuit region, the second via being connected to the middle-layer metal wire and the second upper-layer metal wire being connected to the second via. The top face of the variable resistance element and the top face of the middle-layer metal wire may be in a same plane, and a thickness of the variable resistance element may be different from a thickness of the middle-layer metal wire.

Additionally, another aspect of the method of manufacturing a non-volatile storage device according to the present disclosure may further include: forming a first inter-layer insulating layer above the substrate; concurrently forming the first lower-layer metal wire within the first inter-layer insulating layer in the storage region and forming the second lower-layer metal wire within the first inter-layer insulating layer in the circuit region; forming a second inter-layer insulating layer above first inter-layer insulating layer including the first lower-layer metal wire and the second lower-layer metal wire; forming a lower plug within the second inter-layer insulating layer in the storage region, the lower plug being connected to the first lower-layer metal wire; forming the variable resistance element in the storage region above the second inter-layer insulating layer including the lower plug, the variable resistance element being connected to the lower plug; forming a third inter-layer insulating layer above the second inter-layer insulating layer including the variable resistance element; forming the first via and the middle-layer metal wire within the second inter-layer insulating layer and the third inter-layer insulating layer in the circuit region, the first via being connected to the second lower-layer metal wire and the middle-layer metal wire being connected to the first via; forming a fourth inter-layer insulating layer above the third inter-layer insulating layer including the variable resistance element and the middle-layer metal wire; and concurrently forming an upper plug and the first upper-layer metal wire within the third inter-layer insulating layer and fourth inter-layer insulating layer in the storage region, the upper plug being connected to the variable resistance element and the first upper-layer metal wire being connected to the upper plug, and the second via and the second upper-layer metal wire within the fourth inter-layer insulating layer in the circuit region, the second via being connected to the middle-layer metal wire and the second upper-layer metal wire being connected to the second via. The top face of the variable resistance element may be lower than the top face of the middle-layer metal wire with respect to the surface of the substrate.

Additionally, another aspect of the method of manufacturing a non-volatile storage device according to the present disclosure may further include: forming a first inter-layer insulating layer above the substrate; concurrently forming the first lower-layer metal wire within the first inter-layer insulating layer in the storage region and the second lower-layer metal wire within the first inter-layer insulating layer in the circuit region; forming a second inter-layer insulating layer above first inter-layer insulating layer including the first lower-layer metal wire and the second lower-layer metal wire; forming the first via and the middle-layer metal wire within the second inter-layer insulating layer in the circuit region, the first via being connected to the second lower-layer metal wire and the middle-layer metal wire being connected to the first via; forming a third inter-layer insulating layer above the second inter-layer insulating layer including the first via and the middle-layer metal wire; forming a lower plug within the second inter-layer insulating layer and the third inter-layer insulating layer in the storage region, the lower plug being connected to the first lower-layer metal wire; forming the variable resistance element in the storage region above the second inter-layer insulating layer including the lower plug, the variable resistance element being connected to the lower plug; forming a fourth inter-layer insulating layer above the third inter-layer insulating layer including the variable resistance element; and concurrently forming the first upper-layer metal wire within the fourth inter-layer insulating layer in the storage region, the first upper-layer metal wire being connected to the variable resistance element, and the second via and the second upper-layer metal wire within the third inter-layer insulating layer and the fourth inter-layer insulating layer in the circuit region, the second via being connected to the middle-layer metal wire and the second upper-layer metal wire being connected to the second via. The bottom face of the variable resistance element is higher than the top face of the middle-layer metal wire with respect to the surface of the substrate.

According to such a configuration, a non-volatile storage device which includes a variable resistance element between metal wire layers and is compatible with processes for mass-producing miniature LSI circuits can be realized, and process damage to metal wire occurring during the formation of the variable resistance element can be suppressed.

Embodiments of the present disclosure will be described hereinafter with reference to the drawings.

The following embodiments describe specific examples of the present disclosure. As such, the numerical values, shapes, materials, constituent elements, arrangements and connection states of constituent elements, steps, orders of steps, and the like in the following embodiments are merely examples, and are not intended to limit the present disclosure.

Additionally, items having like reference signs in the drawings may not be described. The drawings are schematic representations of the respective constituent elements for the purpose of facilitating understanding, and may not be an exact representation of the shapes, dimensional ratios, and the like. In the manufacturing method, the order and the like of the processes can be changed as necessary, and other publicly-known processes can be added.

Embodiment 1

A non-volatile storage device according to Embodiment 1 will be described hereinafter with reference to FIG. 1.

FIG. 1 is a cross-sectional view illustrating an example of the overall configuration of non-volatile storage device 100 according to Embodiment 1.

In a practical non-volatile storage device, storage region 60 includes a large number of variable resistance elements 40, but only one of the large number of variable resistance elements 40 is illustrated in the drawings referenced hereinafter in order to simplify the drawings. Some components are enlarged to facilitate understanding as well. Likewise, only one connection structure for vias and wires provided in circuit region 70 adjacent to storage region 60 is illustrated.

As illustrated in FIG. 1, non-volatile storage device 100 according to the present embodiment has a feature in that a top face of variable resistance element 40 is formed at the same height as a top face of middle-layer metal wire 22.

As illustrated in FIG. 1, non-volatile storage device 100 is constituted by storage region 60 and circuit region 70, and includes: substrate 10; first inter-layer insulating layer 11 formed above substrate 10; first lower-layer metal wire 20 formed within first inter-layer insulating layer 11 in storage region 60; second lower-layer metal wire 21 formed within first inter-layer insulating layer in circuit region 70; second inter-layer insulating layer 12 formed above first inter-layer insulating layer 11, which includes first lower-layer metal wire 20 and second lower-layer metal wire 21; lower plug 30 formed in second inter-layer insulating layer 12 and connected to first lower-layer metal wire 20; variable resistance element 40 formed above second inter-layer insulating layer 12 and lower plug 30 so as to connect to lower plug 30, and constituted by lower electrode 41, variable resistance layer 42, and upper electrode 43; third inter-layer insulating layer 13 formed above second inter-layer insulating layer 12 and covering a side face part of variable resistance element 40; first via 31 formed in second inter-layer insulating layer 12 and connected to second lower-layer metal wire 21; middle-layer metal wire 22 formed in second inter-layer insulating layer 12 and third inter-layer insulating layer 13, and connected to first via 31; fourth inter-layer resistance layer 14 formed above third inter-layer insulating layer 13, which includes upper electrode 43 of variable resistance element 40 and middle layer metal wire 22; upper plug 32 formed in fourth inter-layer resistance layer 14 and connected to upper electrode 43 of variable resistance element 40; first upper-layer metal wire 23 connected to upper plug 32; second via 33 formed in fourth inter-layer resistance layer 14 and connected to middle layer metal wire 22; and second upper-layer metal wire 24 connected to second via 33. Here, the top face of variable resistance element 40 and the top face of middle-layer metal wire 22 are formed at the same height relative to a semiconductor substrate surface.

Note that active elements such as transistors, which are electrically connected to variable resistance element 40, may be formed in substrate 10. Additionally, storage region 60 may include a selecting transistor and the like in a 1T1R type storage device, in addition to the variable resistance element, the plugs and wires connected to the variable resistance element, and the like. Furthermore, circuit region 70 may include a bit line decoder, a word line decoder, a power supply circuit, and the like in addition to wires, vias, and the like.

First lower-layer metal wire 20 and second lower-layer metal wire 21 are formed so that surfaces (top faces) thereof are flat and substantially flush with a surface of first inter-layer insulating layer 11.

Variable resistance element 40 can be, for example, a non-volatile storage element having a resistance value that changes reversibly in response to the application of an electrical pulse.

Specifically, variable resistance element 40 may be, for example, ReRAM (Resistive Random Access Memory). Variable resistance element 40 may also be PRAM (Phase-change Random Access Memory) using phase-change recording, MRAM (Magnetoresistive Random Access Memory) using a magnetoresistive effect, FeRAM (Ferroelectric Random Access Memory) using a ferroelectric material, or the like.

Lower electrode 41 may, for example, be constituted by tantalum nitride having a thickness of 10 to 30 nm, but may also be constituted by tungsten, nickel, tantalum, titanium, aluminum, titanium nitride, or the like.

The metal oxide of variable resistance layer 42 may be a transition metal oxide. In this case, if tantalum is employed as the transition metal contained in the transition metal oxide, lower electrode 41 may use a material that exhibits a standard electrode potential less than or equal to that of tantalum and that is less likely to have changes in resistance.

Specifically, at least one material selected from a group consisting of tantalum, tantalum nitride, titanium, titanium nitride, and titanium-aluminum nitride can be used for lower electrode 41. A configuration constituted by such a material can achieve stable memory characteristics.

Lower electrode 41 may be physically connected to lower plug 30, or may be connected to lower plug 30 via a conductor. In the example illustrated in FIG. 1, lower electrode 41 is physically connected to lower plug 30.

Variable resistance layer 42 is provided between lower electrode 41 and upper electrode 43, and based on an electrical signal applied between lower electrode 41 and upper electrode 43, changes reversibly between a high-resistance state and a low-resistance state having a lower resistance value than the high-resistance state.

In the example illustrated in FIG. 1, variable resistance layer 42 is interposed between lower electrode 41 and upper electrode 43, and is configured as a layer constituted by oxygen-deficient tantalum oxide having a thickness of at least 5 nm and at most 50 nm. Note that variable resistance layer 42 may also be constituted by titanium oxide, nickel oxide, hafnium oxide, zirconium oxide, niobium oxide, tungsten oxide, aluminum oxide, or the like.

Variable resistance layer 42 may be constituted by a single layer, or a plurality of layers having different oxygen contents. When constituted by a plurality of layers, at least two layers may be provided, including a first variable resistance layer constituted by a first metal oxide and a second variable resistance layer constituted by a second metal oxide having a higher oxygen content than that of the first metal oxide.

For example, variable resistance layer 42 may have a layered structure including two layers, namely the first variable resistance layer and the second variable resistance layer. Here, the first variable resistance layer may be constituted by oxygen-deficient tantalum oxide ($TaO_x$, where $0<x<2.5$). The second variable resistance layer may be constituted by tantalum oxide having a lower oxygen deficiency than that of the first variable resistance layer ($TaO_y$, where $x<y$).

This example will describe a case where a first metal constituting the first metal oxide and a second metal constituting the second metal oxide are both tantalum. However, the metals are not limited thereto, and the first metal oxide and the second metal oxide may be constituted by other metals instead. The first metal oxide and the second metal oxide may be constituted by metal oxides of different metals as well.

Additionally, the first metal oxide and the second metal oxide constituting variable resistance layer 42 may include at least one oxide selected from a group consisting of a transition metal oxide and aluminum oxide. For example, the first metal oxide and the second metal oxide constituting variable resistance layer 42 may include at least one oxide selected from a group consisting of tantalum oxide, hafnium oxide, and zirconium oxide.

In addition to tantalum, at least one transition metal selected from a group consisting of, for example, titanium (Ti), hafnium (Hf), zirconium (Zr), niobium (Nb), and tungsten (W) may be used as the first metal and the second metal. A transition metal can take on a plurality of oxidation states, and thus different resistance states can be realized through redox reactions. Furthermore, aluminum (Al) may be used as the first metal and the second metal.

For example, when using hafnium oxide, the composition of the first metal oxide constituting the first variable resistance layer is $HfO_x$ and the composition of the second metal oxide constituting the second variable resistance layer is $HfO_y$, and the relationship $x<y$ may be satisfied. Furthermore, x and y may satisfy $0.9 \leq x \leq 1.6$ and $1.8 < y < 2.0$.

In this case, a high oxygen deficiency layer (the first variable resistance layer) using hafnium oxide can be produced through, for example, reactive sputtering using a Hf target and sputtering in argon gas and oxygen gas. As in the case of tantalum oxide described above, the oxygen content of the high oxygen deficiency layer can be adjusted with ease by changing the flow ratio of oxygen gas to argon gas during the reactive sputtering. Note that it is not necessary to heat the substrate, and the substrate temperature may be set to room temperature.

The low oxygen deficiency layer (the second variable resistance layer) using hafnium oxide is formed, for example, by exposing a surface of the high oxygen deficiency layer to a plasma of a mixture of argon gas and oxygen gas. The thickness of the low oxygen deficiency layer can be adjusted with ease through the exposure time to the plasma of the mixture of argon gas and oxygen gas. The second variable resistance layer may be 3 to 4 nm thick.

When using zirconium oxide, the composition of the first metal oxide constituting the first variable resistance layer is $ZrO_x$ and the composition of the second metal oxide constituting the second variable resistance layer is $ZrO_y$, and the relationship x<y may be satisfied. Furthermore, x and y may satisfy $0.9 \leq x \leq 1.4$ and $1.9 < y < 2.0$.

In this case, a high oxygen deficiency layer (the first variable resistance layer) using zirconium oxide can be produced through, for example, reactive sputtering using a Zr target and sputtering in argon gas and oxygen gas. As in the case of tantalum oxide described above, the oxygen content of the high oxygen deficiency layer can be adjusted with ease by changing the flow ratio of oxygen gas to argon gas during the reactive sputtering. The substrate temperature can be room temperature without any particular heating.

The low oxygen deficiency layer (the second variable resistance layer) using zirconium oxide is formed, for example, by exposing a surface layer part of the high oxygen deficiency layer to a plasma of a mixture of argon gas and oxygen gas. The thickness of the low oxygen deficiency layer can be adjusted with ease through the exposure time to the plasma of the mixture of argon gas and oxygen gas. The second variable resistance layer may be 1 to 5 nm thick.

The hafnium oxide layer and the zirconium oxide layer described above can also be formed using Chemical Vapor Deposition (CVD), Atomic Layer Deposition (ALD), or the like instead of sputtering.

A material having a lower oxygen deficiency (higher resistance value) than that of the first metal oxide may be selected for the second metal oxide. By using such a configuration, a voltage applied between the lower electrode and the upper electrode is distributed more to the second variable resistance layer. There is also an abundance of oxygen that can contribute to the reaction near the interface between the upper electrode and the second variable resistance layer. As such, a selective redox reaction occurs at the interface between the upper electrode and the second variable resistance layer, and a stable resistance variation can be realized. The redox reaction can occur more easily in the second variable resistance layer as a result.

Additionally, different metals can be used for the first metal constituting the first metal oxide and the second metal constituting the second metal oxide. The variable resistance phenomenon in the variable resistance layer containing the oxygen-deficient metal oxide is expressed by the transfer of oxygen, and it is therefore sufficient for at least the transfer of oxygen to be possible, even if the type of the matrix metal is different. Accordingly, even if different metals are used for the first metal constituting the first variable resistance layer and the second metal constituting the second variable resistance layer, the same effect can be expected to be achieved.

When different metals are used for the first metal and the second metal, the standard electrode potential of the second metal may be lower than the standard electrode potential of the first metal. This is because the variable resistance phenomenon is thought to arise when a redox reaction occurs in minute filaments (conductive paths) formed in the second metal oxide that constitutes the second variable resistance layer, which has a high resistance, and changes the resistance value thereof.

For example, using oxygen-deficient tantalum oxide for the first variable resistance layer and titanium oxide ($TiO_2$) for the second variable resistance layer enables stable variable resistance operations. Titanium (standard electrode potential=−1.63 eV) is a material having a lower standard electrode potential than tantalum (standard electrode potential=−0.6 eV).

A higher standard electrode potential corresponds to a higher difficulty of oxidation, disposing an oxide of a metal having a lower standard electrode potential than that of the first variable resistance layer in the second variable resistance layer makes it easier for a redox reaction to occur in the second variable resistance layer, which oxidizes more easily.

For example, oxygen-deficient tantalum oxide ($TaO_x$) may be used for the first variable resistance layer, and aluminum oxide ($Al_2O_3$) for the second variable resistance layer, as another combination.

It is sufficient for the high oxygen deficiency layer and the low oxygen deficiency layer to include oxide layers of tantalum, hafnium, zirconium, or the like, or aluminum oxide layers, as the main variable resistance layers that exhibit resistance variations, and may also contain trace amounts of other elements, for example.

It is also possible to intentionally include small amounts of other elements, e.g., to fine-tune the resistance value, and such cases are also included in the scope of the present disclosure. For example, adding nitrogen to the variable resistance layer increases the resistance value of the variable resistance layer and improves the responsiveness of the resistance variation.

When the variable resistance layer is formed using sputtering, unintended trace amounts of elements may intermix with the variable resistance layer due to residual gas, gas escaping from the vacuum chamber walls, or the like, and such trace amounts of elements intermixed with the variable resistance layer are naturally included in the scope of the present disclosure.

In FIG. 1, variable resistance layer 42 does not necessarily have to be constituted by two layers, and may be constituted by three or more layers, or conversely, of only one layer.

Upper electrode 43 is an electrode formed above lower electrode 41. Upper electrode 43 is formed on variable resistance layer 42. Upper electrode 43 may be constituted by, for example, a noble metal material such as iridium, platinum, palladium, or the like having a thickness of at least 5 nm and at most 50 nm.

Upper electrode 43 may, for example, be constituted by at least one material selected from a group consisting of iridium, platinum (Pt), and palladium (Pd), and the metal constituting variable resistance layer 42, as well as lower electrode 41, may be a material having a higher standard electrode potential than that of the material of the upper electrode. By employing this configuration, a redox reaction occurs selectively in variable resistance layer 42, in the vicinity of the interface between upper electrode 43 and variable resistance layer 42, and a stable variable resistance phenomenon is realized as a result.

Additionally, in variable resistance element 40, upper electrode 43 of storage region 60 and middle-layer metal wire 22 of circuit region 70 are formed so that surfaces (top faces) thereof are flat and substantially flush with a surface of third inter-layer insulating layer 13.

First lower-layer metal wire 20, second lower-layer metal wire 21, middle-layer metal wire 22, first upper-layer metal wire 23, and second upper-layer metal wire 24 may all have the same thickness, and first via 31, upper plug 32, and second via 33 may all have the same thickness (height) as well.

FIGS. 2A to 2L are cross-sectional views illustrating a method of manufacturing non-volatile storage device 100 according to Embodiment 1. The method of manufacturing the non-volatile storage device according to the present embodiment will be described hereinafter with reference to FIGS. 2A to 2L.

Figure 2A:
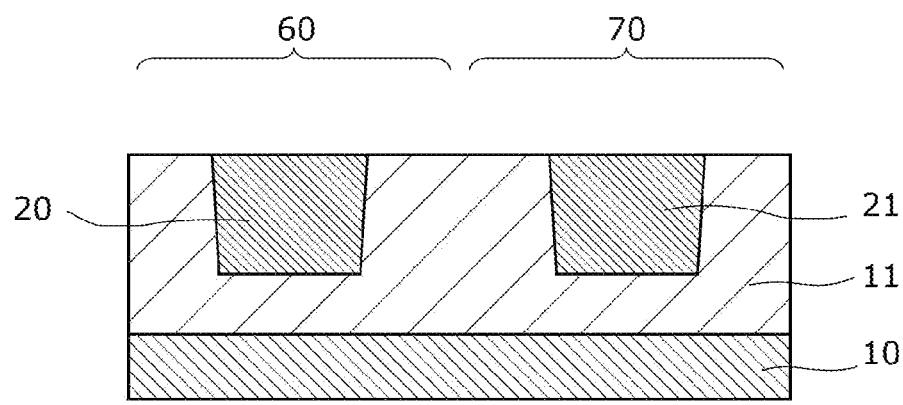
FIG. 2A is a cross-sectional view illustrating a method of manufacturing a non-volatile storage device according to a working example of Embodiment 1.

FIG. 2A is a diagram illustrating a process of forming first lower-layer metal wire 20 in first inter-layer insulating layer 11 in storage region 60 and forming second lower-layer metal wire 21 in first inter-layer insulating layer 11 in circuit region 70.

Here, first inter-layer insulating layer 11 is formed on substrate 10 constituted by a semiconductor on which active elements and the like (not shown) are formed in advance, and first lower-layer metal wire 20 and second lower-layer metal wire 21 are formed in an embedded manner through a damascene method.

Specifically, first inter-layer insulating layer 11, which is constituted by silicon oxide, silicon nitride, silicon oxynitride, silicon oxycarbide, silicon carbonitride, or the like, is formed on substrate 10 using plasma CVD or the like.

Next, wire grooves for forming first lower-layer metal wire 20 and second lower-layer metal wire 21 in first inter-layer insulating layer 11 in an embedded manner are formed through photolithography and dry etching.

Then, a barrier metal layer constituted by tantalum nitride (at least 5 nm and at most 40 nm) and tantalum (at least 5 nm and at most 40 nm), and a wire material of copper (at least 50 nm and at most 300 nm), are deposited in the formed wire grooves using sputtering or the like. Then, the wire grooves are completely filled with the copper serving as the wire material and the barrier metal layer by further depositing copper as a seed, through electroplating or the like.

Then, by removing excess copper and excess barrier metal layer on first inter-layer insulating layer 11 and the surface of the wire grooves through Chemical Mechanical Polishing (CMP), first lower-layer metal wire 20 and second lower-layer metal wire 21 are formed so that the surfaces thereof are flat and flush with the surface (top face) of first inter-layer insulating layer 11.

Figure 2B:
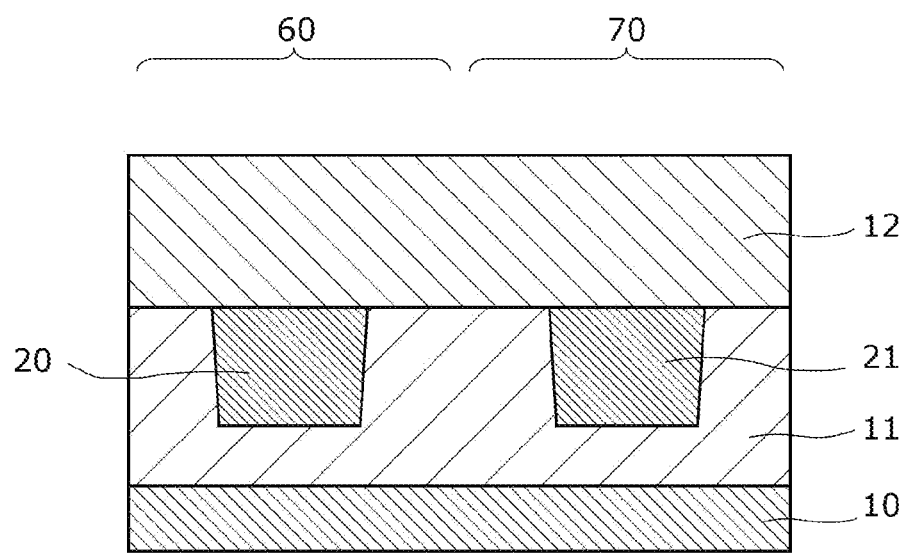
FIG. 2B is a cross-sectional view illustrating a method of manufacturing a non-volatile storage device according to a working example of Embodiment 1.

FIG. 2B is a diagram illustrating a process of forming second inter-layer insulating layer 12 covering first inter-layer insulating layer 11.

Here, second inter-layer insulating layer 12, which is constituted by silicon oxide, silicon nitride, silicon oxynitride, silicon oxycarbide, silicon carbonitride, or the like, is formed, using plasma CVD or the like, on first inter-layer insulating layer 11 in which first lower-layer metal wire 20 and second lower-layer metal wire 21 are formed. As an example, the thickness of second inter-layer insulating layer 12 may be at least 30 nm and at most 200 nm.

Figure 2C:
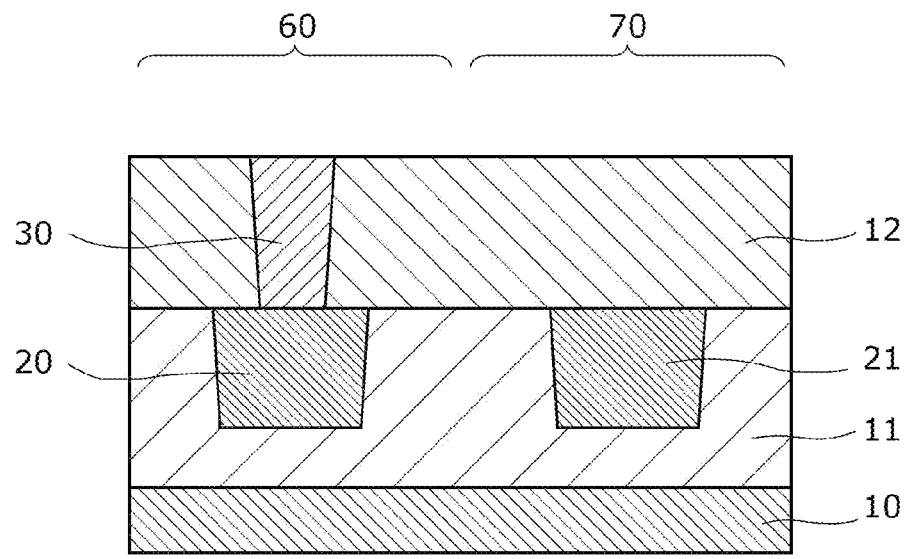
FIG. 2C is a cross-sectional view illustrating a method of manufacturing a non-volatile storage device according to a working example of Embodiment 1.

FIG. 2C is a diagram illustrating a process of forming lower plug 30.

Here, after second inter-layer insulating layer 12 is formed, lower plug 30, which connects to first lower-layer metal wire 20, is formed in second inter-layer insulating layer 12.

Specifically, a plug hole for forming, in second inter-layer insulating layer 12, lower plug 30, which connects to first lower-layer metal wire 20, is formed through photolithography and dry etching. Then, a barrier metal layer constituted by tantalum nitride (thickness: at least 5 nm and at most 40 nm) and tantalum (thickness: at least 5 nm and at most 40 nm), and copper serving as the plug material (thickness: at least 50 nm and at most 300 nm), are deposited, through sputtering, on second inter-layer insulating layer 12 including the plug hole which has been formed. Then, the entire plug hole is filled with the barrier metal layer and the copper by further depositing copper through electroplating or the like. Tungsten or the like can be employed instead of copper as the material for filling.

Then, by removing excess copper and excess barrier metal layer on second inter-layer insulating layer 12 and the surface of the plug hole through CMP, lower plug 30 is formed so that the surface thereof is flat and flush with the surface (top face) of second inter-layer insulating layer 12.

Figure 2D:
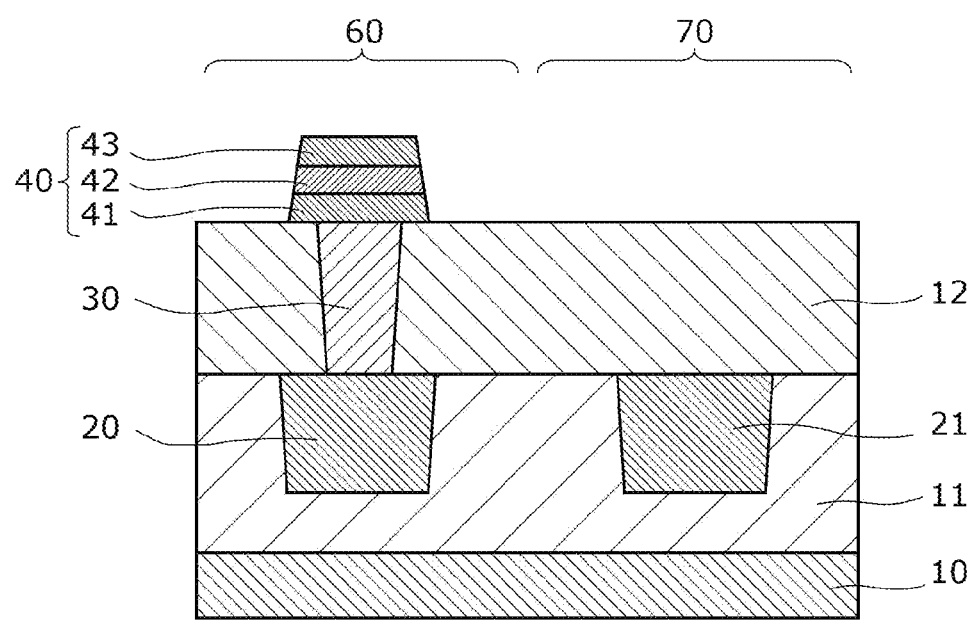
FIG. 2D is a cross-sectional view illustrating a method of manufacturing a non-volatile storage device according to a working example of Embodiment 1.

FIG. 2D is a diagram illustrating a process of forming variable resistance element 40, which connects to lower plug 30, on second inter-layer insulating layer 12.

Here, after lower plug 30 is formed, a lower electrode material layer, a variable resistance material layer, and an upper electrode material layer are formed in that order on second inter-layer insulating layer 12 including lower plug 30.

Specifically, the lower electrode material layer constituted by tantalum nitride (thickness: 20 nm), the variable resistance material layer (thickness: 20 nm), and the upper electrode material layer constituted by iridium (thickness: 40 nm) are deposited through sputtering, in that order, on second inter-layer insulating layer 12 including lower plug 30. Here, the variable resistance material layer is deposited through reactive sputtering using metallic tantalum as a target and the sputtering is performed in an argon atmosphere containing oxygen.

Next, after forming the upper electrode material layer, a resist mask for patterning variable resistance element 40 is formed on the upper electrode material layer using photolithography.

After forming the resist mask, variable resistance element 40 is formed by patterning the upper electrode material layer, the variable resistance material layer, and the lower electrode material layer in that order through dry etching using the resist mask and then removing the resist mask through an ashing process.

Here, forming variable resistance element 40 so as to connect to first lower-layer metal wire 20 by lower plug 30 makes it possible to dispose variable resistance element 40 away from the surface of first lower-layer metal wire 20 by the height of lower plug 30 (equivalent to the thickness of second inter-layer insulating layer 12). This makes it possible to prevent the surface of first lower-layer metal wire 20 from being corroded or altered by chlorine gas, fluorine gas, or the like used during dry etching, oxygen gas used during ashing, and the like when patterning and forming variable resistance element 40.

Figure 2E:
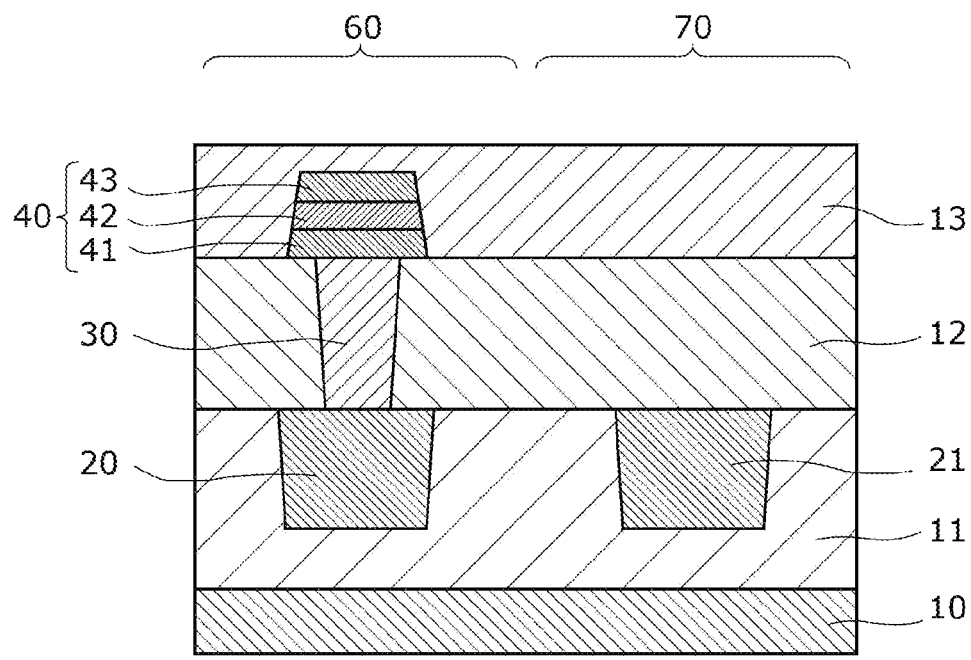
FIG. 2E is a cross-sectional view illustrating a method of manufacturing a non-volatile storage device according to a working example of Embodiment 1.

FIG. 2E is a diagram illustrating a process of forming third inter-layer insulating layer 13 covering variable resistance element 40.

Here, third inter-layer insulating layer 13, which is constituted by silicon oxide, silicon nitride, silicon oxynitride, silicon oxycarbide, silicon carbonitride, or the like, is formed on variable resistance element 40 and second inter-layer insulating layer 12 using plasma CVD or the like. The thickness of third inter-layer insulating layer 13 can be at least 100 nm and at most 500 nm.

Immediately after third inter-layer insulating layer 13 is deposited through plasma CVD or the like, the height of the top face of third inter-layer insulating layer 13 differs between storage region 60, where variable resistance element 40 is formed, and circuit region 70, where no variable resistance element is formed. Accordingly, CMP or the like is used to align the height of, and flatten, the top face of third inter-layer insulating layer 13 between storage region 60 and circuit region 70. The thickness of third inter-layer insulating layer 13 on variable resistance element 40 after the CMP can be at least 10 nm and at most 100 nm.

Figure 2F:
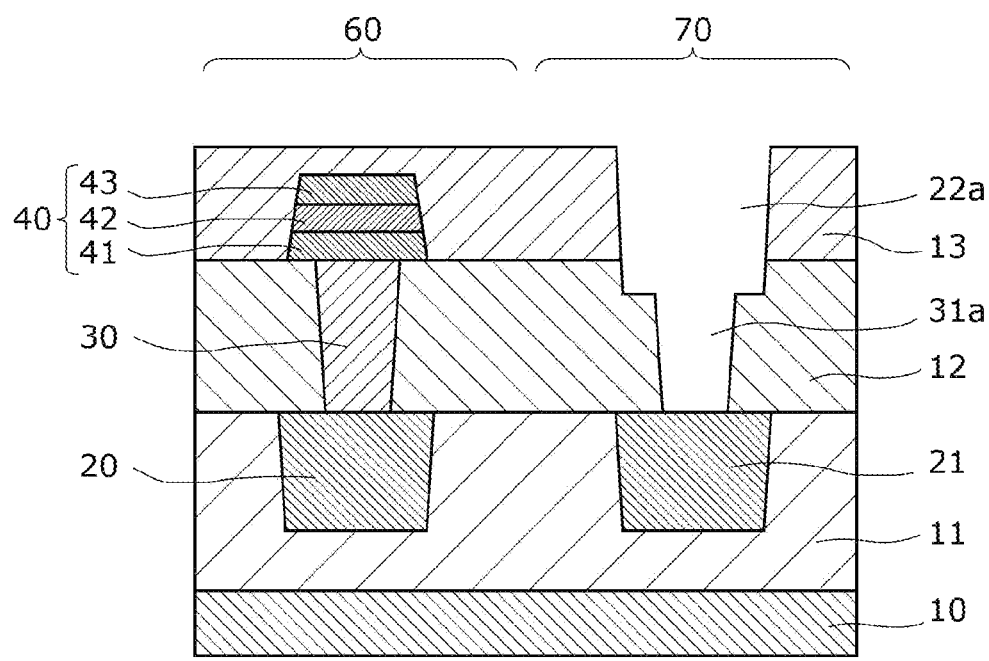
FIG. 2F is a cross-sectional view illustrating a method of manufacturing a non-volatile storage device according to a working example of Embodiment 1.
Figure 2G:
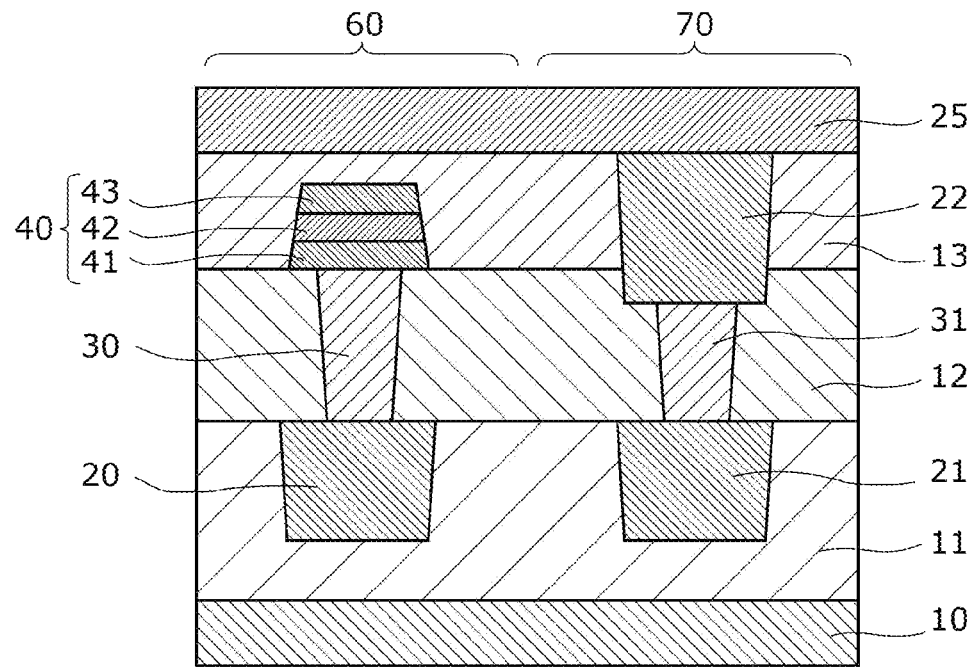
FIG. 2G is a cross-sectional view illustrating a method of manufacturing a non-volatile storage device according to a working example of Embodiment 1.
Figure 2H:
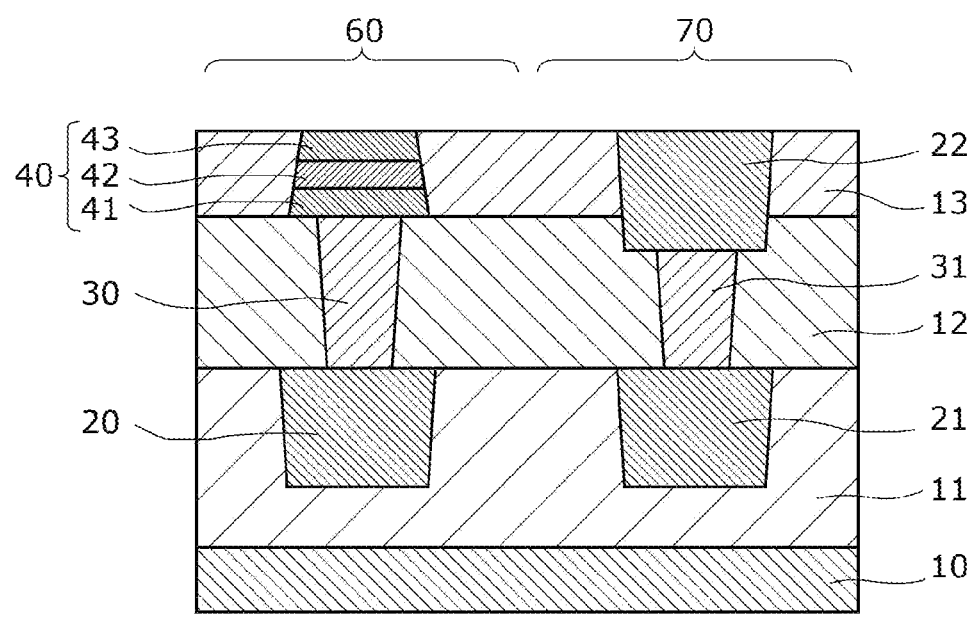
FIG. 2H is a cross-sectional view illustrating a method of manufacturing a non-volatile storage device according to a working example of Embodiment 1.

FIGS. 2F to 2H are diagrams illustrating processes of forming first via 31 and middle-layer metal wire 22.

As illustrated in FIG. 2F, after third inter-layer insulating layer 13 is flattened, first via hole 31a, which is for forming first via 31 in an embedded manner so as to connect to second lower-layer metal wire 21, is formed in third inter-layer insulating layer 13 and second inter-layer insulating layer 12 in circuit region 70. Furthermore, wire groove 22a, which is for forming middle-layer metal wire 22 in an embedded manner so as to connect to first via hole 31a, is formed in third inter-layer insulating layer 13 and second inter-layer insulating layer 12.

Specifically, after the top face of third inter-layer insulating layer 13 is flattened, first via hole 31a is formed through photolithography and dry etching. Photolithography and dry etching are then performed once again to form wire groove 22a.

In general, first via hole 31a for first via 31 is formed first by the first instance of photolithography and dry etching, and wire groove 22a for middle-layer metal wire 22 is formed by the second instance of photolithography and dry etching. However, first via hole 31a may instead be formed after wire groove 22a is formed.

Next, as illustrated in FIG. 2G, after first via hole 31a and wire groove 22a are formed, a barrier metal layer constituted by tantalum nitride (thickness: at least 5 nm and at most 40 nm) and tantalum (thickness: at least 5 nm and at most 40 nm), and copper serving as a wire material (thickness: at least 50 nm and at most 300 nm), are deposited, through sputtering, in first via hole 31a and wire groove 22a. Then, through electroplating or the like, the wire material and barrier metal layer 25 are formed by further depositing copper, and first via hole 31a and wire groove 22a are completely filled with the copper serving as the wire material and the barrier metal layer.

Then, as illustrated in FIG. 2H, of the deposited copper, the excess copper and excess barrier metal layer on the surface are removed through CMP, and the surface of third inter-layer insulating layer 13 and middle-layer metal wire 22 are CMP-polished by overpolishing until the surface (top face) of upper electrode 43 of variable resistance element 40 is exposed, and the surface of third inter-layer insulating layer 13, the surface of upper electrode 43, and the surface of middle-layer metal wire 22 are finished so as to be flush.

Figure 2I:
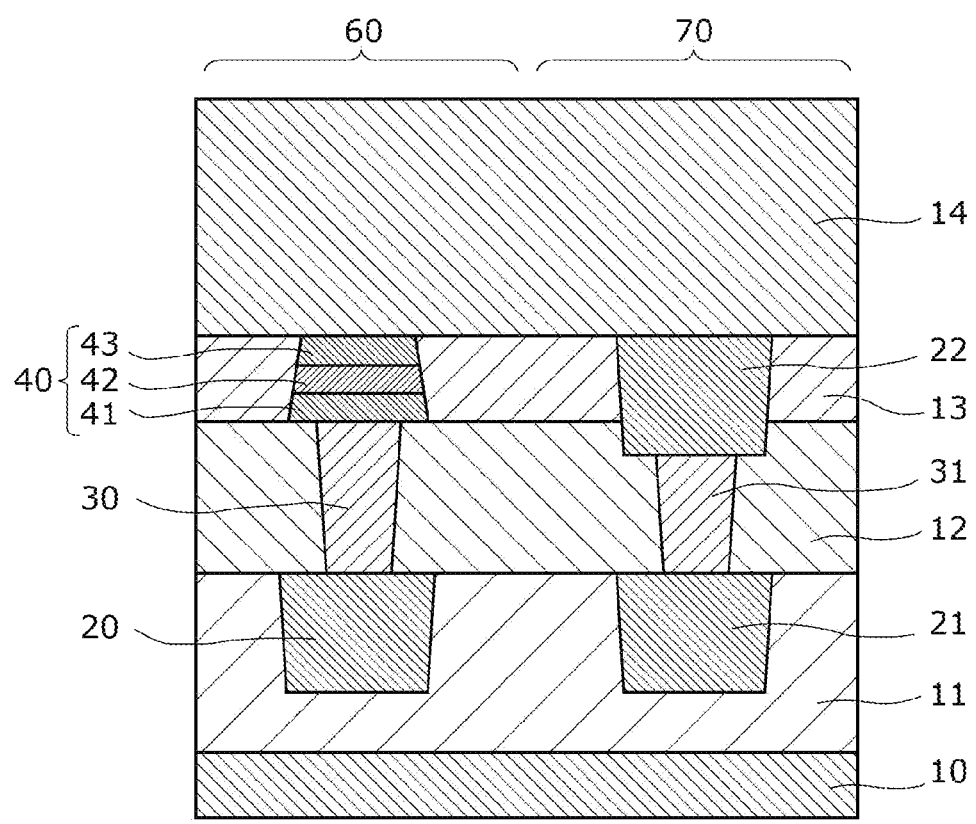
FIG. 2I is a cross-sectional view illustrating a method of manufacturing a non-volatile storage device according to a working example of Embodiment 1.

FIG. 2I is a diagram illustrating a process of forming fourth inter-layer resistance layer 14 on third inter-layer insulating layer 13.

Here, fourth inter-layer resistance layer 14, which is constituted by silicon oxide, silicon nitride, silicon oxynitride, silicon oxycarbide, silicon carbonitride, or the like, is formed on upper electrode 43 of variable resistance element 40, middle-layer metal wire 22, and third inter-layer insulating layer 13 using plasma CVD or the like. The thickness of fourth inter-layer resistance layer 14 can be at least 100 nm and at most 300 nm.

Figure 2J:
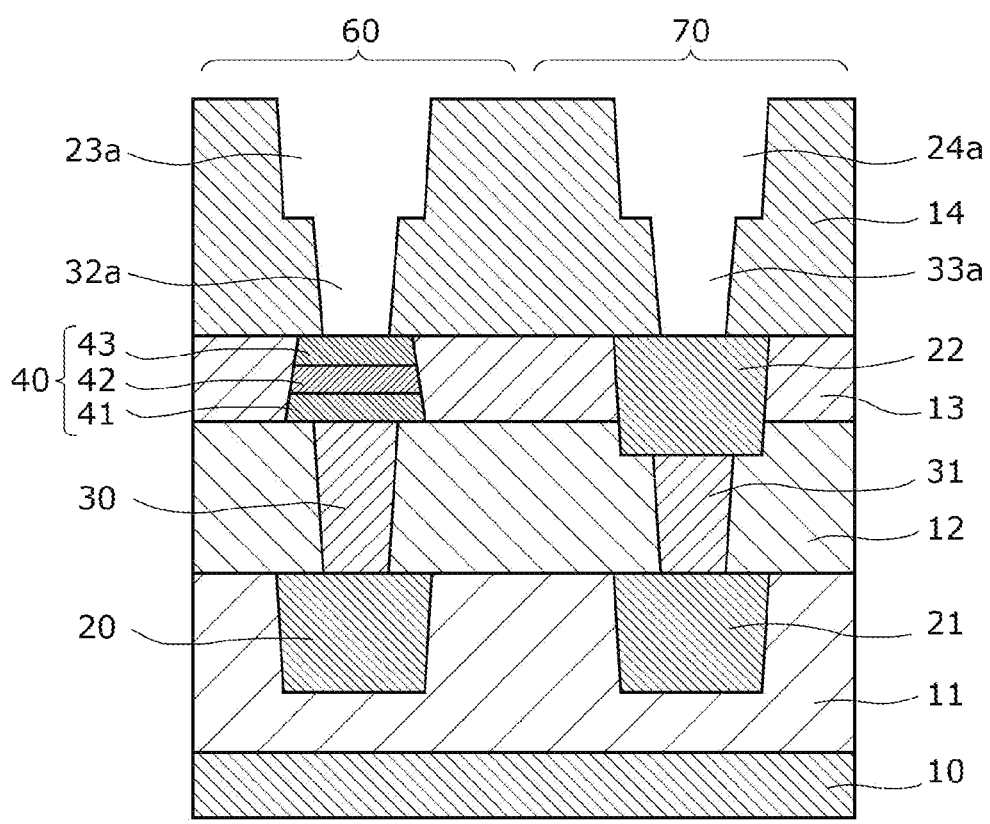
FIG. 2J is a cross-sectional view illustrating a method of manufacturing a non-volatile storage device according to a working example of Embodiment 1.
Figure 2K:
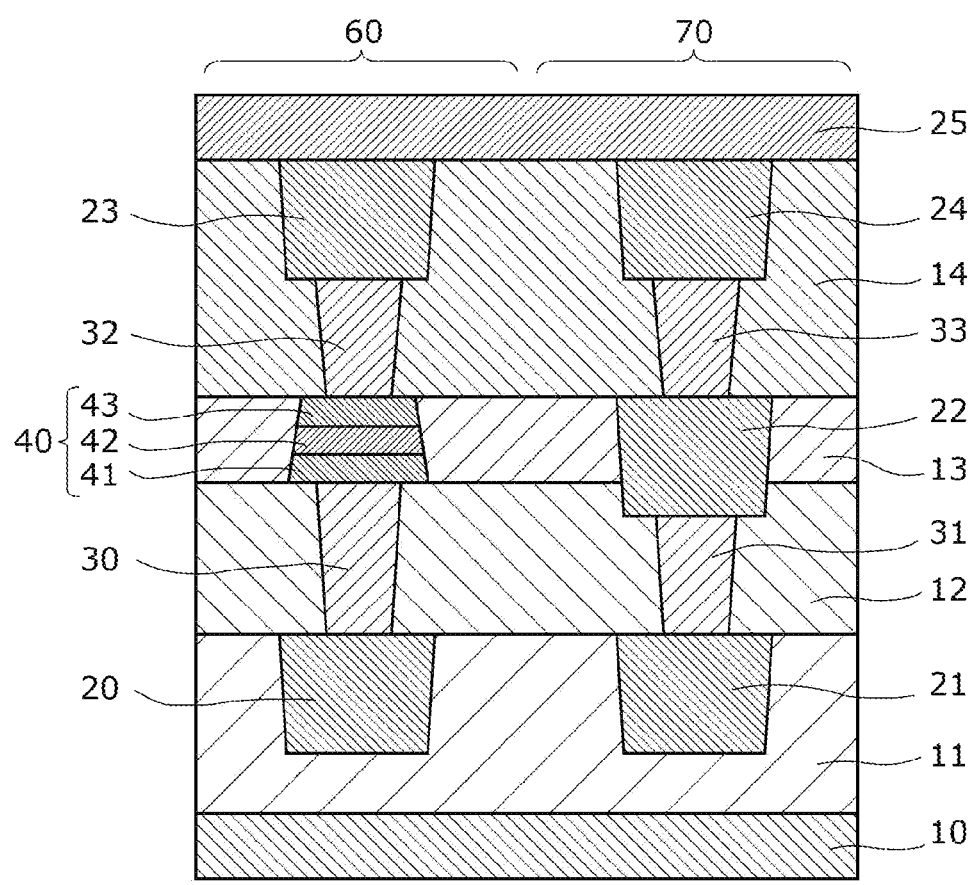
FIG. 2K is a cross-sectional view illustrating a method of manufacturing a non-volatile storage device according to a working example of Embodiment 1.
Figure 2L:
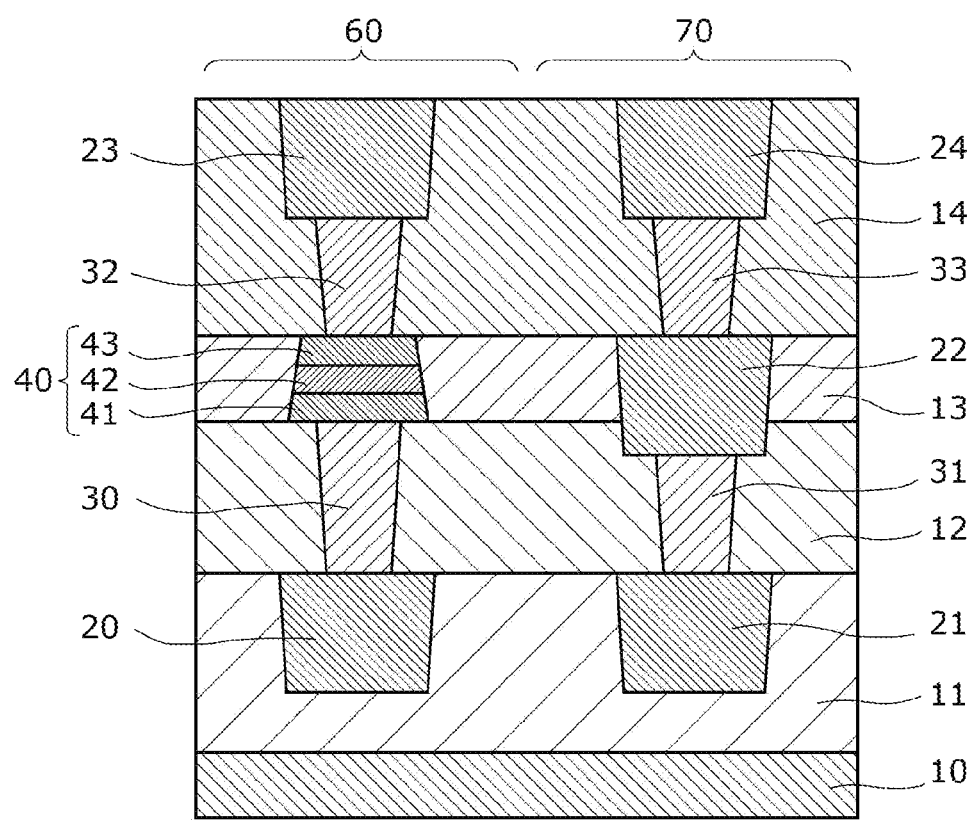
FIG. 2L is a cross-sectional view illustrating a method of manufacturing a non-volatile storage device according to a working example of Embodiment 1.

FIGS. 2J to 2L are diagrams illustrating processes of forming upper plug 32 and second via 33, as well as first upper-layer metal wire 23 and second upper-layer metal wire 24.

As illustrated in FIG. 2J, after fourth inter-layer resistance layer 14 is formed, upper plug hole 32a, which is for forming upper plug 32 connecting to upper electrode 43 of variable resistance element 40 in an embedded manner, is formed in fourth inter-layer resistance layer 14 in storage region 60. Additionally, second via hole 33a, which is for forming second via 33 connecting to middle-layer metal wire 22 in an embedded manner, is formed in fourth inter-layer resistance layer 14 in circuit region 70.

In FIG. 2I, the surface of third inter-layer insulating layer 13, the surface of upper electrode 43, and the surface of middle-layer metal wire 22 are flattened so that the surfaces are flush, resulting in upper plug hole 32a and second via hole 33a having the same depths. Accordingly, the processes for forming upper plug hole 32a and second via hole 33a through dry etching can be simplified, and both holes can be formed at the same time.

Furthermore, wire groove 23a, which is for forming first upper-layer metal wire 23 in an embedded manner so as to connect to upper plug hole 32a, and wire groove 24a, which is for forming second upper-layer metal wire 24 in an embedded manner so as to connect to second via hole 33a, are formed in fourth inter-layer resistance layer 14.

Specifically, after fourth inter-layer resistance layer 14 is formed, upper plug hole 32a and second via hole 33a are formed at the same time through photolithography and dry etching. Photolithography and dry etching are then performed once again to form wire grooves 23a and 24a at the same time.

In general, upper plug hole 32a and second via hole 33a are formed first by the first instance of photolithography and dry etching, and wire grooves 23a and 24a are formed by the second instance of photolithography and dry etching. However, wire grooves 23a and 24a may instead be formed first.

Next, as illustrated in FIG. 2K, after upper plug hole 32a, second via hole 33a, and wire grooves 23a and 24a are formed, a barrier metal layer constituted by tantalum nitride (thickness: at least 5 nm and at most 40 nm) and tantalum (thickness: at least 5 nm and at most 40 nm), and copper serving as a wire material (thickness: at least 50 nm and at most 300 nm), are deposited, through sputtering, in upper plug hole 32a, second via hole 33a, and wire grooves 23a and 24a. Then, through electroplating or the like, the wire material and barrier metal layer 25 are formed by further depositing copper, and upper plug hole 32a, second via hole 33a, and wire grooves 23a and 24a are completely filled with the copper serving as the wire material and the barrier metal layer.

Then, as illustrated in FIG. 2L, of the deposited copper, the excess copper and excess barrier metal layer on the surface are removed through CMP, thus forming first upper-layer metal wire 23 and second upper-layer metal wire 24 which have flat surfaces and are flush with the surface of fourth inter-layer resistance layer 14.

As described thus far, according to the non-volatile storage device and the method of manufacturing the same according to the present embodiment, a non-volatile storage device which includes a variable resistance element between metal wire layers and which is compatible with existing mass-production processes of miniature LSI circuits can be realized.

Additionally, even if the process of forming the variable resistance element is added to a past semiconductor manufacturing process, the occurrence of process damage to metal wire caused by the process of forming the variable resistance element can be suppressed.

Embodiment 2

A non-volatile storage device according to Embodiment 2 will be described hereinafter with reference to FIG. 3.

Figure 3:
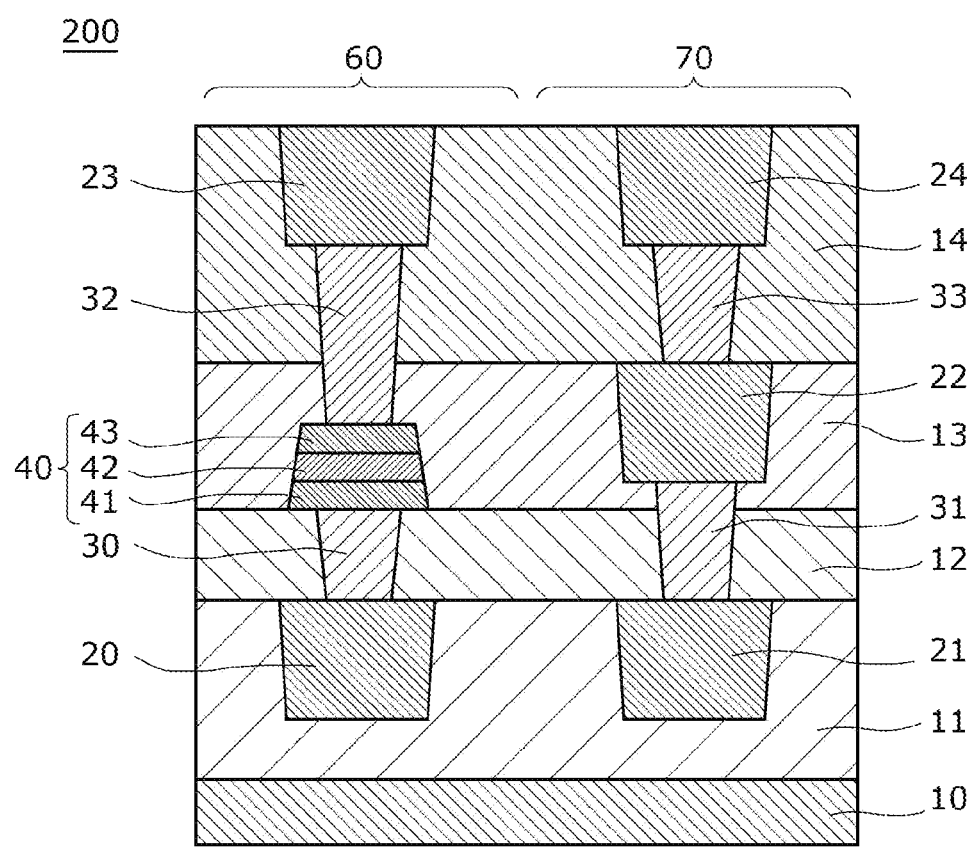
FIG. 3 is a cross-sectional view illustrating an example of the overall configuration of a non-volatile storage device according to Embodiment 2.

FIG. 3 is a cross-sectional view illustrating an example of the overall configuration of non-volatile storage device 200 according to Embodiment 2.

As in Embodiment 1, only one variable resistance element 40 in storage region 60, and only one wire and via connection structure in the same layer in circuit region 70, are illustrated in the present embodiment.

FIGS. 4A to 4F are cross-sectional views illustrating a method of manufacturing non-volatile storage device 200 according to Embodiment 2. The non-volatile storage device, and the method of manufacturing the same, according to the present embodiment will be described hereinafter with reference to FIGS. 3 and 4A to 4F.

As illustrated in FIG. 3, non-volatile storage device 200 according to Embodiment 2 has a feature in that the top face of variable resistance element 40 is formed at a position lower than that of the top face of middle-layer metal wire 22.

The method of manufacturing according to the present embodiment will be described hereinafter with reference to FIGS. 4A to 4F, but some descriptions may be omitted for processes that are the same as in Embodiment 1.

Figure 4A:
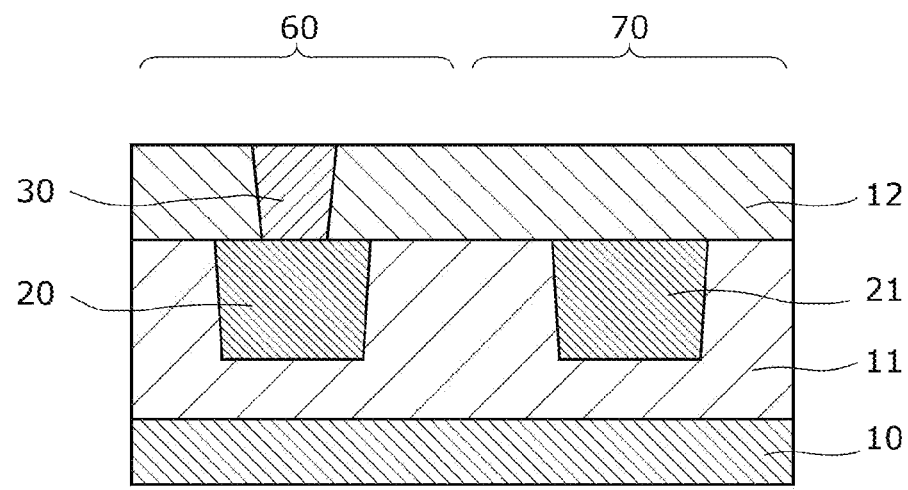
FIG. 4A is a cross-sectional view illustrating a method of manufacturing a non-volatile storage device according to a working example of Embodiment 2.

FIG. 4A is a diagram illustrating processes of forming first lower-layer metal wire 20 and second lower-layer metal wire 21 in first inter-layer insulating layer 11 on substrate 10, forming second inter-layer insulating layer 12 on first inter-layer insulating layer 11 which includes first lower-layer metal wire 20 and second lower-layer metal wire 21, and forming lower plug 30 connected to first lower-layer metal wire 20 in second inter-layer insulating layer 12 in storage region 60.

Specifically, a plug hole for forming, in second inter-layer insulating layer 12, lower plug 30, which connects to first lower-layer metal wire 20, is formed through photolithography and dry etching.

Then, a barrier metal layer constituted by tantalum nitride and tantalum, and copper serving as the plug material, are deposited, through sputtering, on second inter-layer insulating layer 12 including the plug hole which has been formed. Then, the entire plug hole is filled with the barrier metal layer and the copper by further depositing copper through electroplating or the like. Then, by removing excess copper and excess barrier metal layer on second inter-layer insulating layer 12 and the surface of the plug hole through CMP, lower plug 30 is formed so that the surface thereof is flat and flush with the surface of second inter-layer insulating layer 12.

Figure 4B:
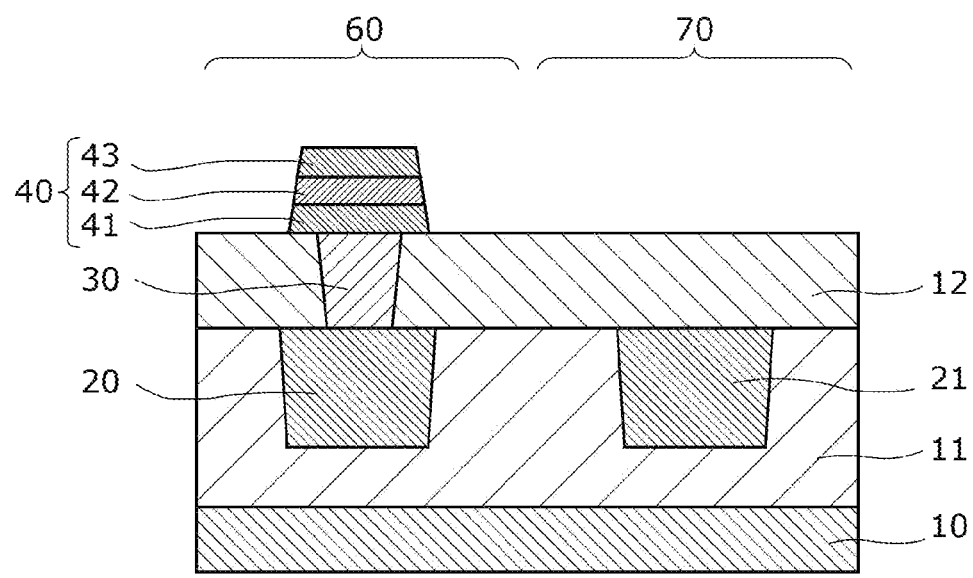
FIG. 4B is a cross-sectional view illustrating a method of manufacturing a non-volatile storage device according to a working example of Embodiment 2.

FIG. 4B is a diagram illustrating a process of forming variable resistance element 40, which connects to lower plug 30, on second inter-layer insulating layer 12.

The specific process of forming variable resistance element 40 is the same as that described in Embodiment 1 with reference to FIG. 2D, and thus will not be described in detail here.

Here, in the present embodiment as well, forming variable resistance element 40 to connect to first lower-layer metal wire 20 by lower plug 30 makes it possible to dispose variable resistance element 40 away from the surface of first lower-layer metal wire 20 by the height of lower plug 30 (equivalent to the thickness of second inter-layer insulating layer 12). This makes it possible to prevent the surface of first lower-layer metal wire 20 from being corroded or altered by chlorine gas, fluorine gas, or the like used during dry etching, oxygen gas used during ashing, and the like when patterning and forming variable resistance element 40.

Figure 4C:
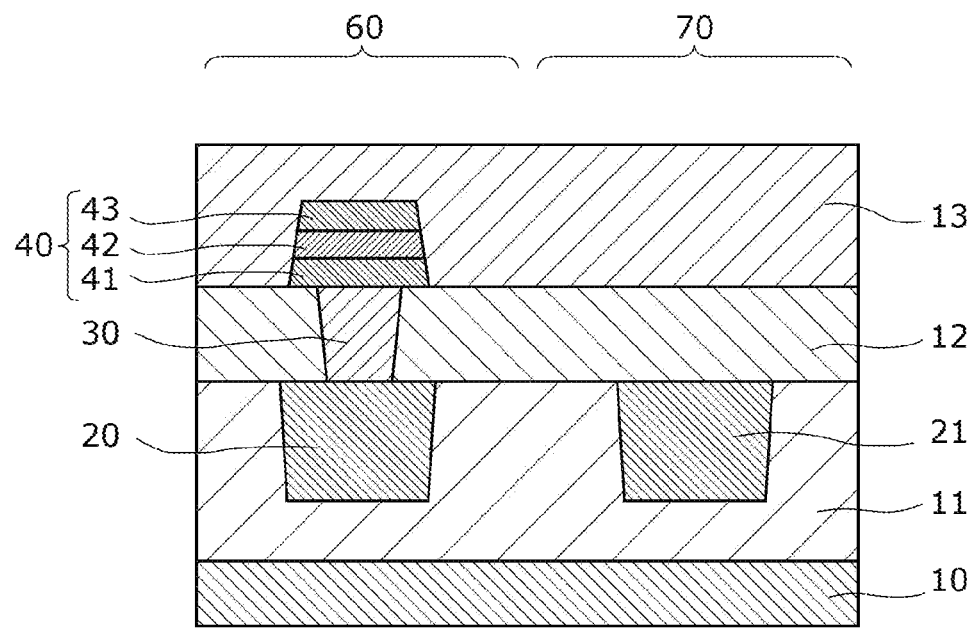
FIG. 4C is a cross-sectional view illustrating a method of manufacturing a non-volatile storage device according to a working example of Embodiment 2.

FIG. 4C is a diagram illustrating a process of forming third inter-layer insulating layer 13 covering variable resistance element 40.

Here, third inter-layer insulating layer 13, which is constituted by silicon oxide, silicon nitride, silicon oxynitride, silicon oxycarbide, silicon carbonitride, or the like, is formed on second inter-layer insulating layer 12 including variable resistance element 40 using plasma CVD or the like. The thickness of third inter-layer insulating layer 13 can be at least 100 nm and at most 500 nm.

Immediately after third inter-layer insulating layer 13 is deposited through plasma CVD or the like, the height of the top face of third inter-layer insulating layer 13 differs between storage region 60, where variable resistance element 40 is formed, and circuit region 70, where no variable resistance element is formed. Accordingly, CMP or the like is used to align the height of, and flatten, the top face of third inter-layer insulating layer 13 between storage region 60 and circuit region 70. The thickness of third inter-layer insulating layer 13 on variable resistance element 40 after the CMP can be at least 10 nm and at most 100 nm.

Figure 4D:
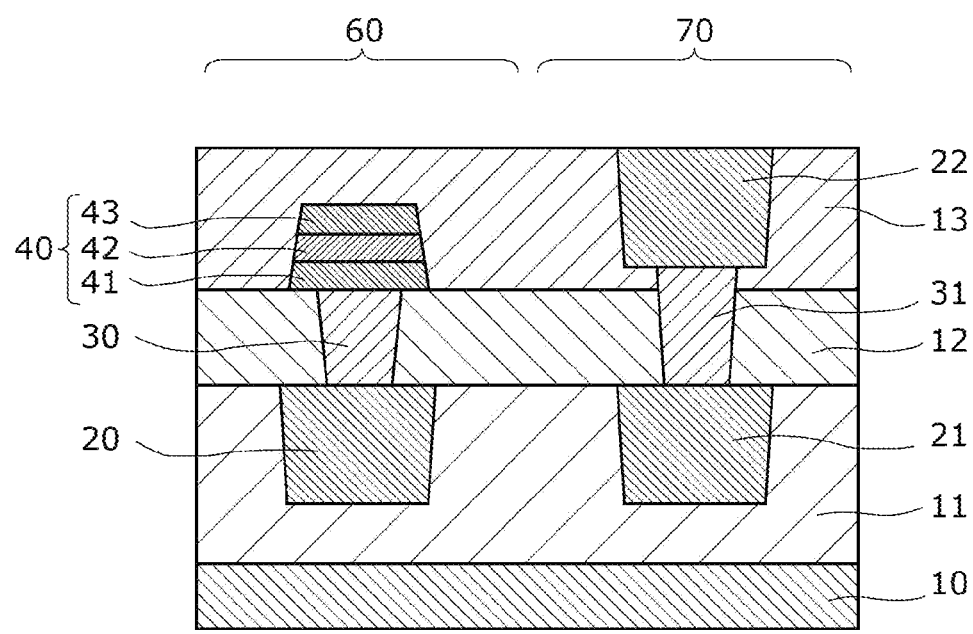
FIG. 4D is a cross-sectional view illustrating a method of manufacturing a non-volatile storage device according to a working example of Embodiment 2.

FIG. 4D is a diagram illustrating processes of forming first via 31 and middle-layer metal wire 22.

After third inter-layer insulating layer 13 is flattened, first via hole 31a is formed, connecting to second lower-layer metal wire 21, in third inter-layer insulating layer 13 and second inter-layer insulating layer 12 in circuit region 70, and middle-layer metal wire 22 is formed in third inter-layer insulating layer 13 so as to connect to first via 31.

Specifically, after the top face of third inter-layer insulating layer 13 is flattened, the via hole is formed through photolithography and dry etching. Photolithography and dry etching are then performed once again to form the wire groove. Next, a barrier metal layer constituted by tantalum nitride and tantalum, and copper serving as a wire material, are deposited, though sputtering or the like, in the via hole and the wire groove. Then, the via hole and the wire groove are completely filled with the copper serving as the wire material and the barrier metal layer by further depositing copper, through electroplating or the like. Then, of the deposited copper, the excess copper and excess barrier metal layer on the surface are removed through CMP, thus forming first via 31, and furthermore forming middle-layer metal wire 22 which has a flat surface and is flush with the surface of third inter-layer insulating layer 13.

Unlike the method of manufacturing according to Embodiment 1, in the present embodiment, it is not necessary to expose upper electrode 43 of variable resistance element 40 when removing the excess copper and excess barrier metal layer from third inter-layer insulating layer 13 using CMP. Accordingly, the CMP process becomes easier, and because upper electrode 43 of variable resistance element 40 remains covered by third inter-layer insulating layer 13, the surface of upper electrode 43 does not make contact with the polishing pad, slurry, or the like during CMP and is therefore not scraped, corroded, or altered.

In the present embodiment as well, in general, the via hole for first via 31 is formed first by the first instance of photolithography and dry etching, and the wire groove for middle-layer metal wire 22 is formed by the second instance of photolithography and dry etching. However, the via hole may instead be formed after the wire groove is formed.

Figure 4E:
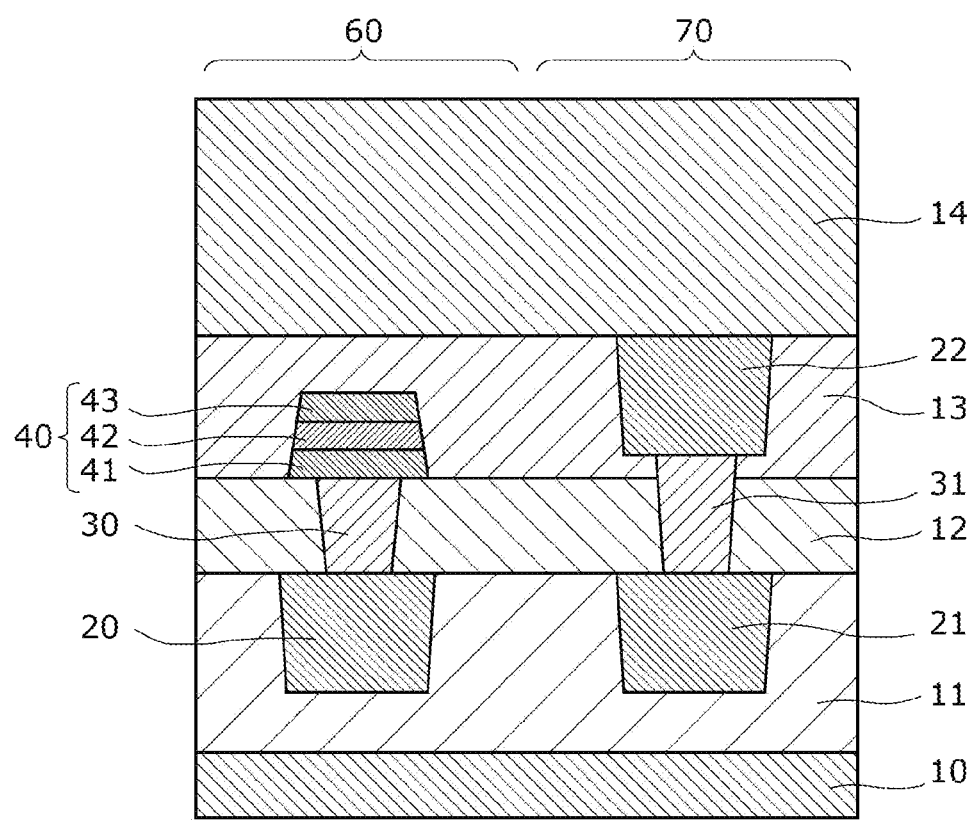
FIG. 4E is a cross-sectional view illustrating a method of manufacturing a non-volatile storage device according to a working example of Embodiment 2.

FIG. 4E is a diagram illustrating a process of forming fourth inter-layer resistance layer 14 on third inter-layer insulating layer 13.

Here, fourth inter-layer resistance layer 14, which is constituted by silicon oxide, silicon nitride, silicon oxynitride, silicon oxycarbide, silicon carbonitride, or the like, is formed on third inter-layer insulating layer 13 including middle-layer metal wire 22 using plasma CVD or the like. The thickness of fourth inter-layer resistance layer 14 can be at least 100 nm and at most 300 nm.

Figure 4F:
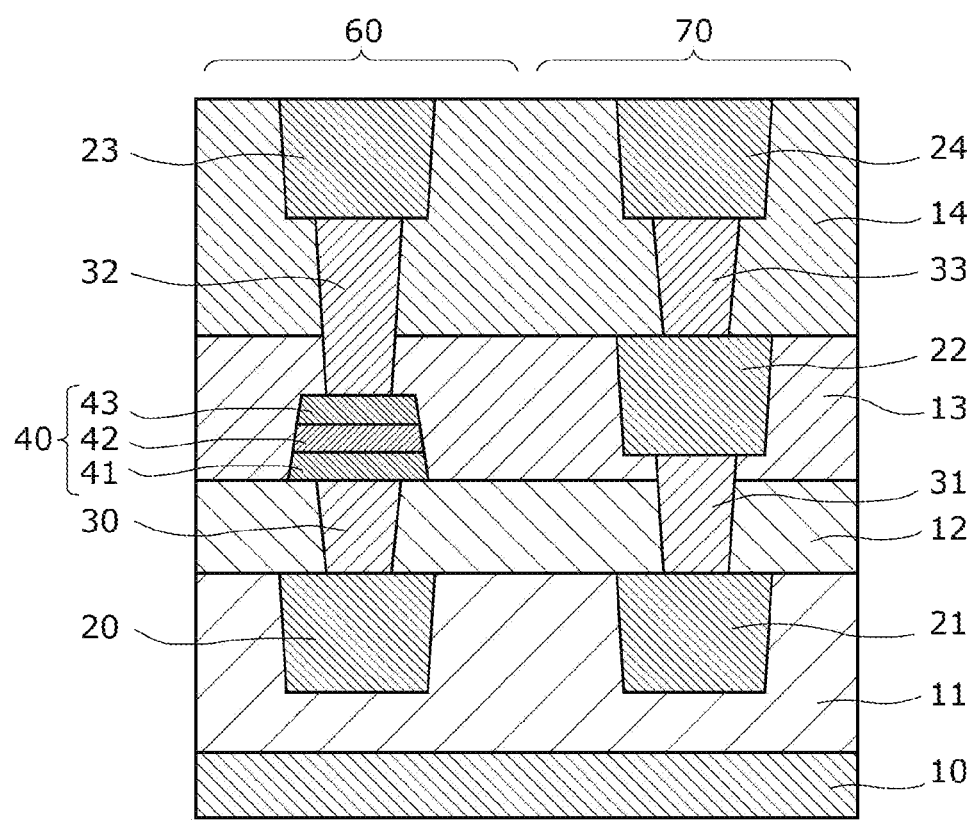
FIG. 4F is a cross-sectional view illustrating a method of manufacturing a non-volatile storage device according to a working example of Embodiment 2.

FIG. 4F is a diagram illustrating processes of forming upper plug 32 and second via 33, as well as first upper-layer metal wire 23 and second upper-layer metal wire 24.

As illustrated in FIG. 4E, after fourth inter-layer resistance layer 14 is formed, upper plug 32, which connects to upper electrode 43 of variable resistance element 40, is formed in fourth inter-layer resistance layer 14 and third inter-layer insulating layer 13 in storage region 60, and first upper-layer metal wire 23, which connects to upper plug 32, is formed in fourth inter-layer resistance layer 14.

Additionally, second via 33, which connects to middle-layer metal wire 22, and second upper-layer metal wire 24, which connects to second via 33, are formed in fourth inter-layer resistance layer 14 in circuit region 70.

Here, the present embodiment differs from Embodiment 1 in that the top face of variable resistance element 40 is disposed at a position lower than the top face of middle-layer metal wire 22. Accordingly, although upper plug 32 is higher than second via 33, in the process of dry etching performed when forming the upper plug hole for upper plug 32 and the second via hole for second via 33, the etching rate of fourth inter-layer resistance layer 14 is faster (a higher etching rate selection ratio) than the etching rate of the copper serving as the wire material constituting middle-layer metal wire 22. Accordingly, the top face of middle-layer metal wire 22 undergoes almost no etching, and the upper plug hole and second via hole can be formed at the same time.

Embodiment 3

A non-volatile storage device according to Embodiment 3 will be described hereinafter with reference to FIG. 5.

Figure 5:
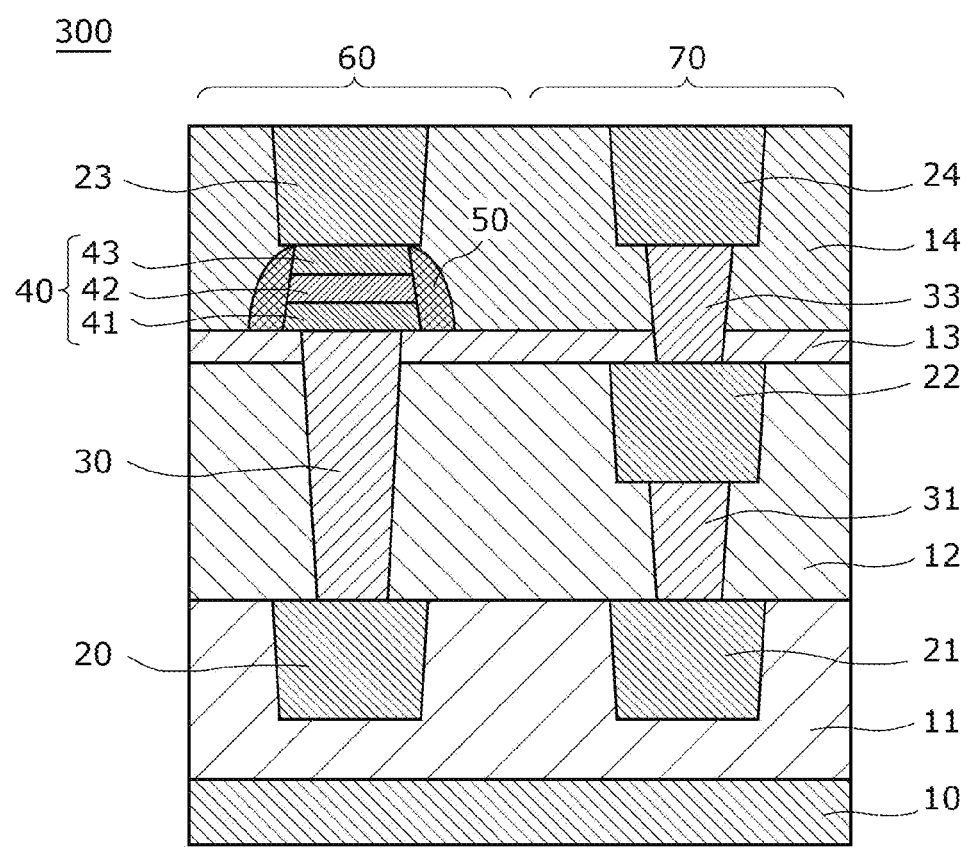
FIG. 5 is a cross-sectional view illustrating an example of the overall configuration of a non-volatile storage device according to Embodiment 3.

FIG. 5 is a cross-sectional view illustrating an example of the overall configuration of non-volatile storage device 300 according to Embodiment 3.

As in Embodiment 1, only one variable resistance element 40 in storage region 60, and only one wire and via connection structure in the same layer in circuit region 70, are illustrated in the present embodiment.

FIGS. 6A to 6H are cross-sectional views illustrating a method of manufacturing non-volatile storage device 300 according to Embodiment 3. The non-volatile storage device, and the method of manufacturing the same, according to the present embodiment will be described hereinafter with reference to FIGS. 5 and 6A to 6H.

As illustrated in FIG. 5, non-volatile storage device 300 according to Embodiment 3 has the following features: a bottom face of variable resistance element 40 is formed at a position higher than the top face of middle-layer metal wire 22; side wall protection layer 50, which is constituted by an insulator such as silicon nitride, is provided at a side wall part of variable resistance element 40; and a top face of upper electrode 43 of variable resistance element 40 is directly connected to a bottom face of first upper-layer metal wire 23.

The method of manufacturing according to the present embodiment will be described hereinafter with reference to FIGS. 6A to 6H, but some descriptions may be omitted for processes that are the same as in Embodiment 1.

Figure 6A:
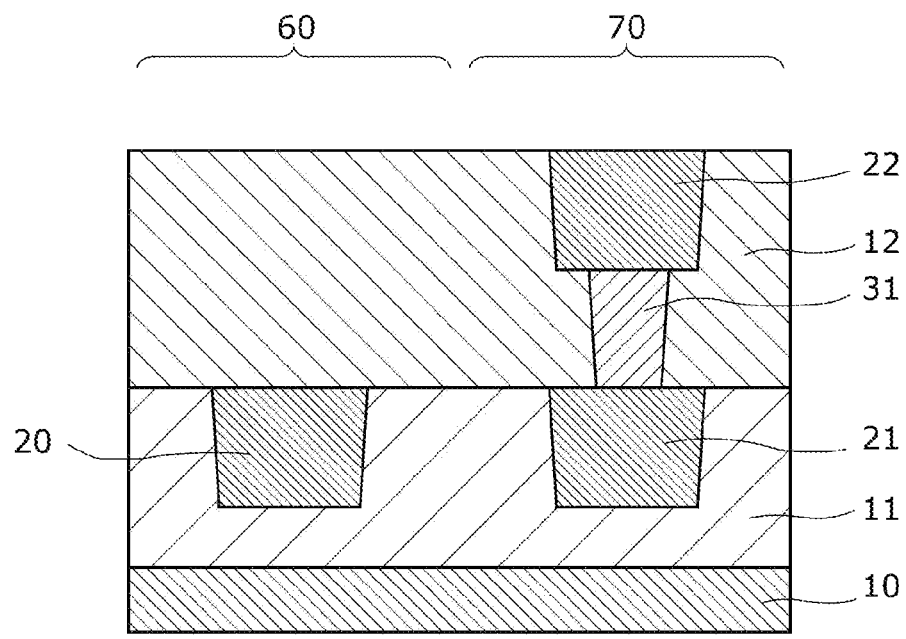
FIG. 6A is a cross-sectional view illustrating a method of manufacturing a non-volatile storage device according to a working example of Embodiment 3.

FIG. 6A is a diagram illustrating processes of forming first lower-layer metal wire 20 and second lower-layer metal wire 21 in first inter-layer insulating layer 11 on substrate 10, forming second inter-layer insulating layer 12 on first inter-layer insulating layer 11 which includes first lower-layer metal wire 20 and second lower-layer metal wire 21, and forming first via 31, which connects to second lower-layer metal wire 21, and middle-layer metal wire 22, which connects to first via 31, in second inter-layer insulating layer 12 in circuit region 70.

Figure 6B:
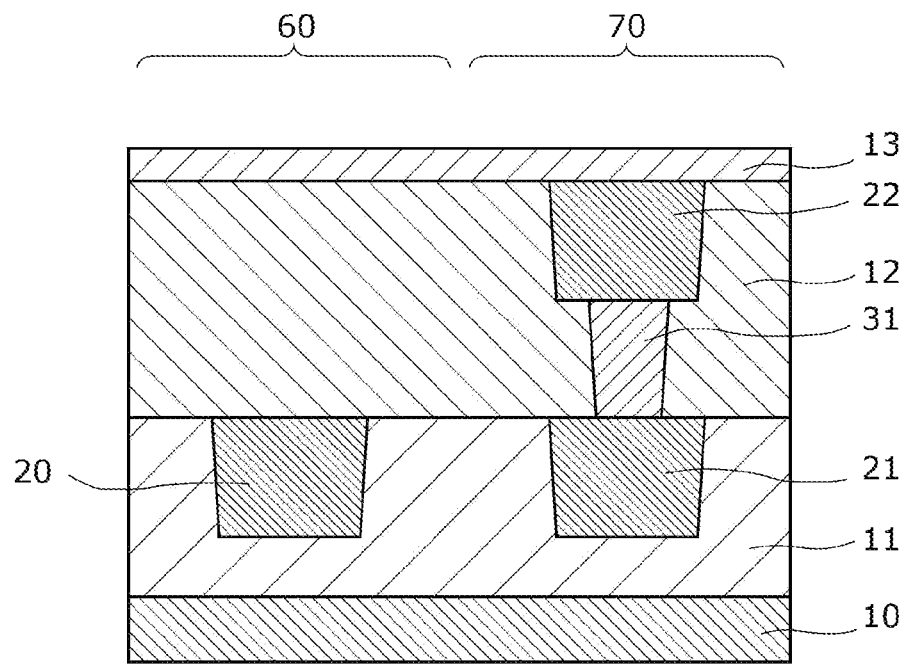
FIG. 6B is a cross-sectional view illustrating a method of manufacturing a non-volatile storage device according to a working example of Embodiment 3.

FIG. 6B is a diagram illustrating a process of forming third inter-layer insulating layer 13 on second inter-layer insulating layer 12 including middle-layer metal wire 22.

Here, third inter-layer insulating layer 13, which is constituted by silicon oxide, silicon nitride, silicon oxynitride, silicon oxycarbide, silicon carbonitride, or the like, is formed on second inter-layer insulating layer 12 using plasma CVD or the like. The thickness of third inter-layer insulating layer 13 can be at least 10 nm and at most 100 nm.

Figure 6C:
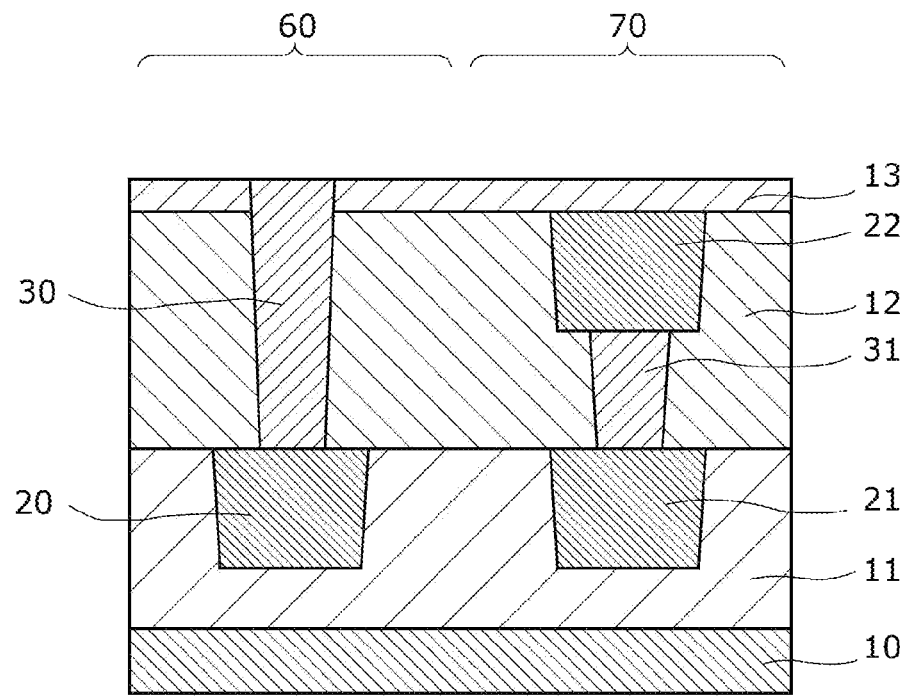
FIG. 6C is a cross-sectional view illustrating a method of manufacturing a non-volatile storage device according to a working example of Embodiment 3.

FIG. 6C is a diagram illustrating a process of forming lower plug 30, which connects to first lower-layer metal wire 20, in second inter-layer insulating layer 12 and third inter-layer insulating layer 13 in storage region 60.

In the present embodiment, variable resistance element 40 is formed so that bottom face of variable resistance element 40 is at a higher position than top face of middle-layer metal wire 22, and it is therefore necessary to have lower plug 30 higher than in Embodiment 1 and Embodiment 2. This make increase the aspect ratio of lower plug 30 and make it difficult to fill lower plug 30 with the barrier metal layer and the plug material.

In that case, however, the diameter of lower plug 30 may be increased to an extent at which the top face of lower plug 30 does not protrude from the bottom face of variable resistance element 40, which is formed later, in a plan view, and the opening may be widened to make it easy to fill the barrier metal layer and the plug material.

Figure 6D:
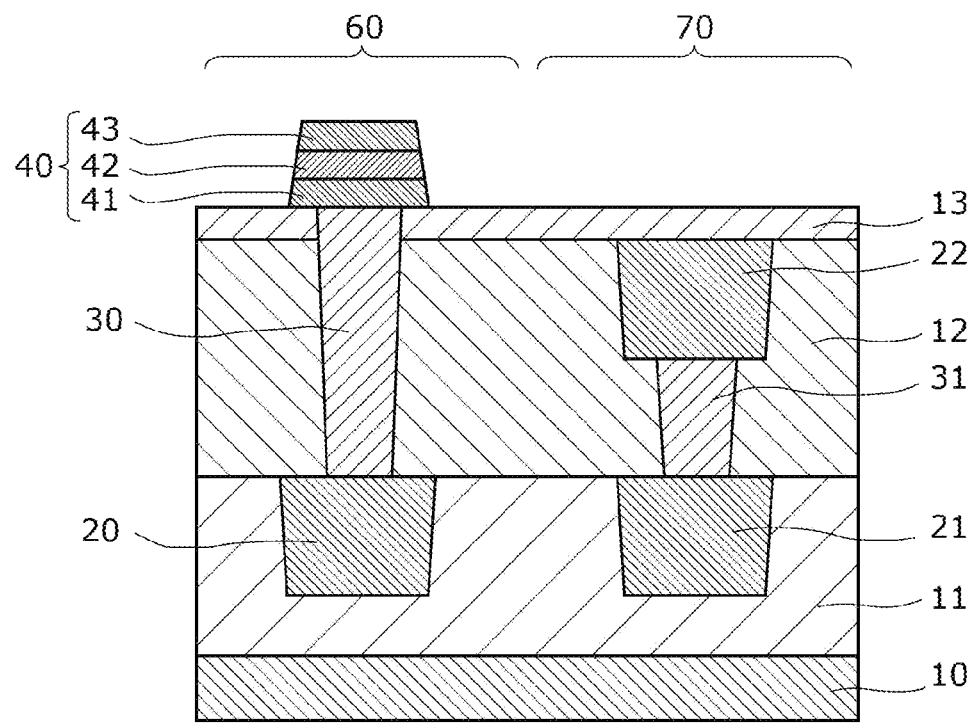
FIG. 6D is a cross-sectional view illustrating a method of manufacturing a non-volatile storage device according to a working example of Embodiment 3.

FIG. 6D is a diagram illustrating a process of forming variable resistance element 40, which connects to lower plug 30, on third inter-layer insulating layer 13.

In the present embodiment, seen in a cross-sectional view, variable resistance element 40 is, due to lower plug 30 formed earlier, disposed distanced upward from the top face of middle-layer metal wire 22 by the thickness of third inter-layer insulating layer 13, and thus middle-layer metal wire 22 can be prevented from being corroded, altered, or the like by chlorine gas or fluorine gas used during dry etching, oxygen gas used during ashing, and the like when patterning and forming the variable resistance element.

Figure 6E:
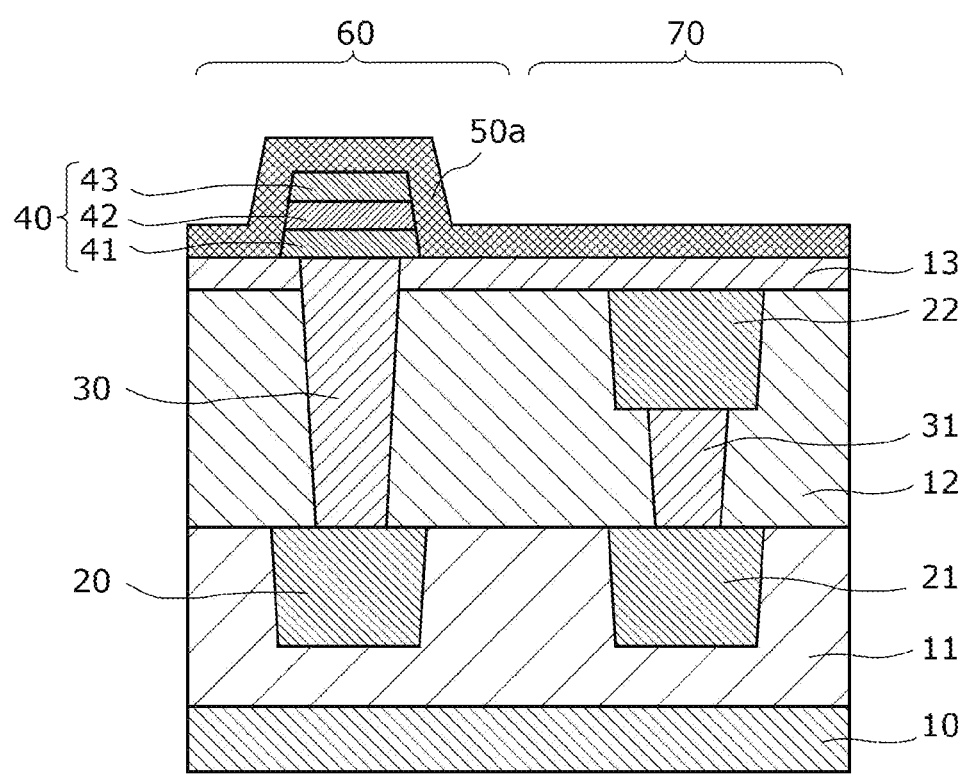
FIG. 6E is a cross-sectional view illustrating a method of manufacturing a non-volatile storage device according to a working example of Embodiment 3.

FIG. 6E is a diagram illustrating a process of forming protective film 50a so as to cover the surface of variable resistance element 40.

Here, protective film 50a, which is constituted by, for example, silicon nitride, is deposited through plasma CVD or the like. The thickness of protective film 50a is at least 30 nm and at most 100 nm. In addition to silicon nitride, oxides, nitrides, or oxynitrides (e.g., aluminum oxide, titanium oxide, or the like) that are insulative and have oxygen barrier properties may be used for protective film 50a.

Figure 6F:
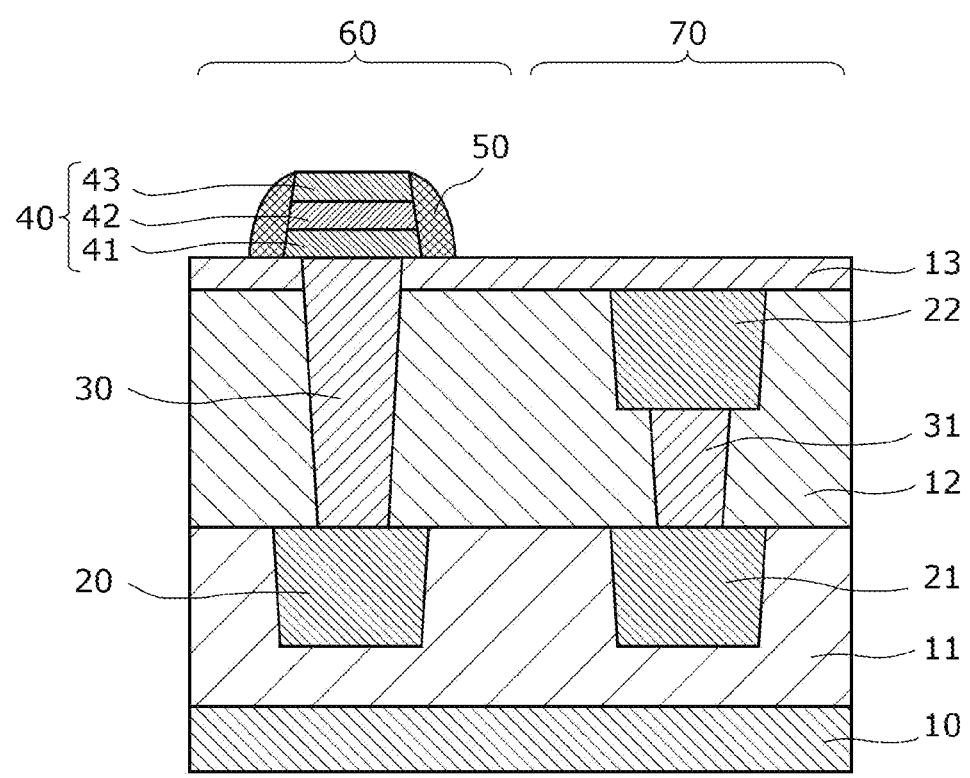
FIG. 6F is a cross-sectional view illustrating a method of manufacturing a non-volatile storage device according to a working example of Embodiment 3.

FIG. 6F is a diagram illustrating a process of forming side wall protection layer 50.

Here, after depositing protective film 50a, protective film 50a is parts aside from the side wall part of variable resistance element 40 (on upper electrode 43 and third inter-layer insulating layer 13) is removed through the etch-back method to form side wall protection layer 50.

Figure 6G:
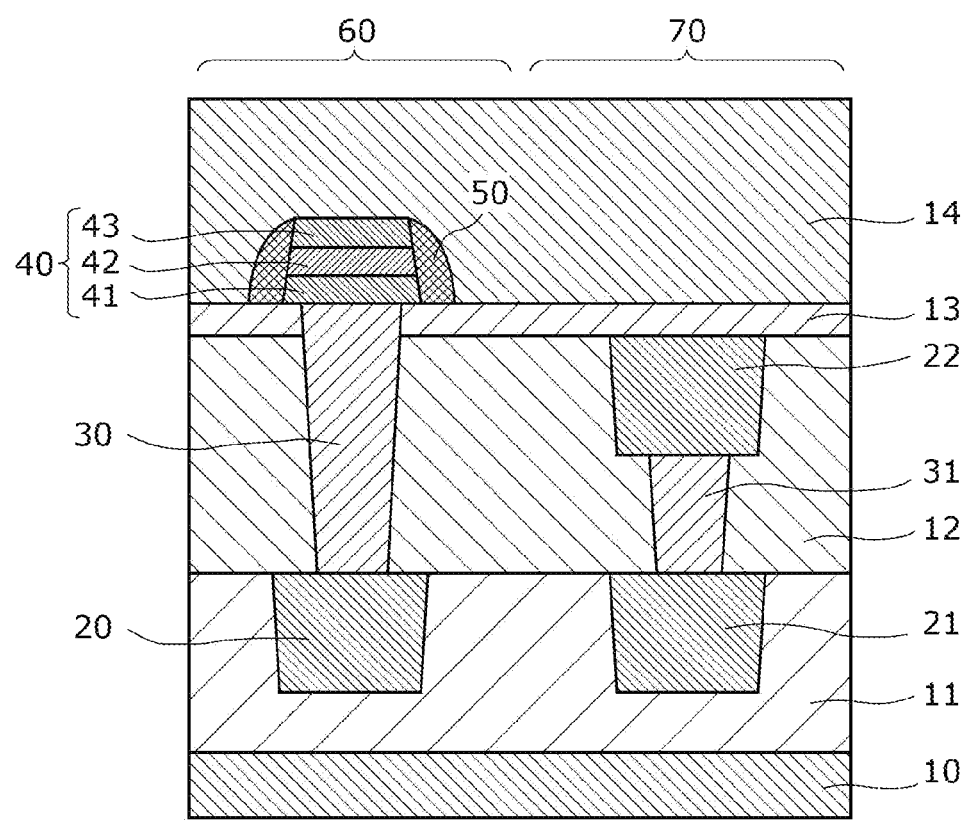
FIG. 6G is a cross-sectional view illustrating a method of manufacturing a non-volatile storage device according to a working example of Embodiment 3.

FIG. 6G is a diagram illustrating a process of forming fourth inter-layer resistance layer 14 on third inter-layer insulating layer 13 including variable resistance element 40 and side wall protection layer 50.

Here, fourth inter-layer resistance layer 14, which is constituted by silicon oxide, silicon nitride, silicon oxynitride, silicon oxycarbide, silicon carbonitride, or the like, is deposited using plasma CVD or the like, and the top faces of fourth inter-layer resistance layer 14 in storage region 60 and circuit region 70 are flattened and aligned through CMP. The thickness of fourth inter-layer resistance layer 14 on variable resistance element 40 after the CMP can be at least 50 nm and at most 200 nm.

Here, side wall protection layer 50, which is constituted by silicon nitride, functions as a barrier film against moisture, oxygen, and the like. Accordingly, covering the side wall part of variable resistance element 40 with side wall protection layer 50 makes it possible to prevent variable resistance layer 42 of variable resistance element 40 from oxidizing from the side wall part due to source gas, oxygen plasma, and the like in the process of depositing fourth inter-layer resistance layer 14, and prevent oxygen contained in fourth inter-layer resistance layer 14 from diffusing into variable resistance layer 42 in subsequent heat treatment.

Figure 6H:
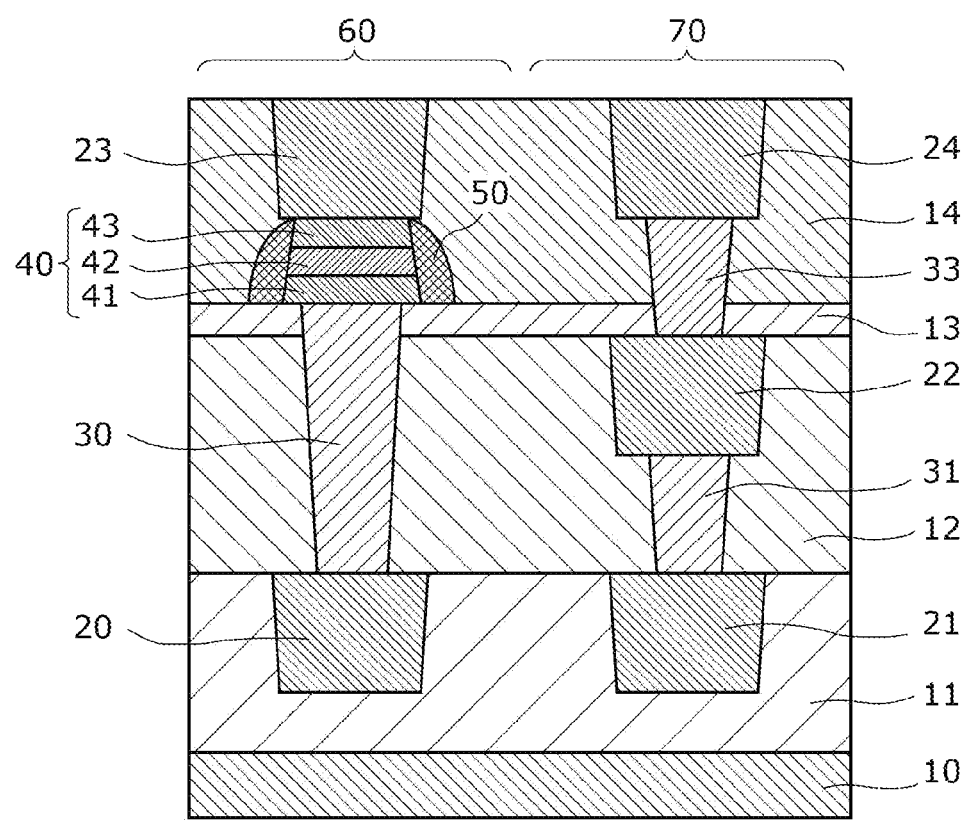
FIG. 6H is a cross-sectional view illustrating a method of manufacturing a non-volatile storage device according to a working example of Embodiment 3.

FIG. 6H is a diagram illustrating processes of forming second via 33, first upper-layer metal wire 23, and second upper-layer metal wire 24.

Here, after fourth inter-layer resistance layer 14 is formed, first upper-layer metal wire 23, which connects to upper electrode 43 of variable resistance element 40, is formed in fourth inter-layer resistance layer 14 in storage region 60; and at the same time, second via 33, which connects to middle-layer metal wire 22, is formed in third inter-layer insulating layer 13 and fourth inter-layer resistance layer 14 in circuit region 70, and second upper-layer metal wire 24, which connects to second via 33, is formed in fourth inter-layer resistance layer 14.

Here, covering the side wall part of variable resistance element 40 with side wall protection layer 50 ensures that side wall protection layer 50 is present at the side face part of variable resistance layer 42 even if the wire groove in which first upper-layer metal wire 23 is formed in an embedded manner is deep. This makes it possible to prevent variable resistance layer 42 from being exposed in wire groove, and thus first upper-layer metal wire 23 can be prevented from making direct contact with the side face of variable resistance layer 42. As a result, leakage current can be prevented from flowing from first upper-layer metal wire 23 to variable resistance layer 42 without going through upper electrode 43.

Based on the foregoing descriptions, it will be clear to one skilled in the art that many improvements and other embodiments of the present disclosure are possible. As such, the foregoing descriptions are to be understood only as examples, and substantial changes to the specific structures and/or functions can be made without departing from the spirit of the present disclosure.

INDUSTRIAL APPLICABILITY

The non-volatile storage device according to the present disclosure can include a variable resistance element between metal wire layers without affecting the device characteristics of the variable resistance element, LSI circuit operations, and the like, and without producing damage in the manufacturing process, and is therefore particularly useful when mounting variable resistance elements in miniature LSI circuits.

The invention claimed is:

1. A non-volatile storage device including a storage region formed above a substrate and a circuit region in a periphery of the storage region, the non-volatile storage device comprising:
   a first lower-layer metal wire, a lower plug connected to the first lower-layer metal wire, a variable resistance element connected to the lower plug, and a first upper-layer metal wire electrically connected to the variable resistance element, formed in stated order from below in the storage region; and
   a second lower-layer metal wire, a first via connected to the second lower-layer metal wire, a middle-layer metal wire connected to the first via, a second via connected to the middle-layer metal wire, and a second upper-layer metal wire connected to the second via, formed in stated order from below in the circuit region,
   wherein the first lower-layer metal wire and the second lower-layer metal wire are formed in a same layer,
   the first upper-layer metal wire and the second upper-layer metal wire are formed in a same layer,
   at least one of top faces of the variable resistance element and the middle-layer metal wire or bottom faces of the variable resistance element and the middle-layer metal wire are located at different heights with respect to a surface of the substrate,
   the variable resistance element has a tapered shape in which a width of the variable resistance element in a cross-sectional view decreases in an upward direction, and
   the top face of the variable resistance element is located upward from the bottom face of the middle-layer metal wire.

2. The non-volatile storage device according to claim 1, wherein the variable resistance element and the middle-layer metal wire are formed in a same inter-layer insulation film, and
   the top face of the variable resistance element and the top face of the middle-layer metal wire are in a same plane.

3. The non-volatile storage device according to claim 1, wherein the variable resistance element and the middle-layer metal wire are formed in a same inter-layer insulation film, and
   the top face of the variable resistance element and the top face of the middle-layer metal wire are not in a same plane.

4. The non-volatile storage device according to claim 3, wherein the top face of the variable resistance element is lower than the top face of the middle-layer metal wire with respect to the surface of the substrate.

5. The non-volatile storage device according to claim 1, wherein the bottom face of the variable resistance element is higher than the top face of the middle-layer metal wire with respect to the surface of the substrate.

6. The non-volatile storage device according to claim 5, wherein the top face of the variable resistance element is in direct contact with the first upper-layer metal wire.

7. The non-volatile storage device according to claim 1, wherein the top face of the variable resistance element is higher than the top face of the middle-layer metal wire with respect to the surface of the substrate.

8. The non-volatile storage device according to claim 7, wherein the top face of the variable resistance element is in direct contact with the first upper-layer metal wire.

9. A method of manufacturing a non-volatile storage device including a storage region formed above a substrate and a circuit region in a periphery of the storage region, the method comprising:
forming a first lower-layer metal wire, a lower plug connected to the first lower-layer metal wire, a variable resistance element connected to the lower plug, and a first upper-layer metal wire electrically connected to the variable resistance element in stated order from below in the storage region; and
forming a second lower-layer metal wire, a first via connected to the second lower-layer metal wire, a middle-layer metal wire connected to the first via, a second via connected to the middle-layer metal wire, and a second upper-layer metal wire connected to the second via in stated order from below in the circuit region,
wherein the first lower-layer metal wire and the second lower-layer metal wire are formed in a same layer,
the first upper-layer metal wire and the second upper-layer metal wire are formed in a same layer,
a top face of the variable resistance element and a top face of the middle-layer metal wire are located at different heights with respect to a surface of the substrate, or a bottom face of the variable resistance element and a bottom face of the middle-layer metal wire are located at different heights with respect to the surface of the substrate, or the top face of the variable resistance element and the top face of the middle-layer metal wire are located at different heights with respect to the surface of the substrate and the bottom face of the variable resistance element and the bottom face of the middle-layer metal wire are located at different heights with respect to the surface of the substrate,
the variable resistance element has a tapered shape in which a width of the variable resistance element in a cross-sectional view decreases in an upward direction, and
the top face of the variable resistance element is located upward from the bottom face of the middle-layer metal wire.

10. The method of manufacturing a non-volatile storage device according to claim 9, the method further comprising:
forming a first inter-layer insulating layer above the substrate;
concurrently forming the first lower-layer metal wire within the first inter-layer insulating layer in the storage region and the second lower-layer metal wire within the first inter-layer insulating layer in the circuit region;
forming a second inter-layer insulating layer above the first inter-layer insulating layer including the first lower-layer metal wire and the second lower-layer metal wire;
forming a lower plug within the second inter-layer insulating layer in the storage region, the lower plug being connected to the first lower-layer metal wire;
forming the variable resistance element in the storage region above the second inter-layer insulating layer including the lower plug, the variable resistance element being connected to the lower plug;
forming a third inter-layer insulating layer above the second inter-layer insulating layer including the variable resistance element;
forming the first via and the middle-layer metal wire within the second inter-layer insulating layer and the third inter-layer insulating layer in the circuit region, the first via being connected to the second lower-layer metal wire and the middle-layer metal wire being connected to the first via;
forming a fourth inter-layer insulating layer above the third inter-layer insulating layer including the variable resistance element and the middle-layer metal wire; and
concurrently forming an upper plug and the first upper-layer metal wire within the fourth inter-layer insulating layer in the storage region, the upper plug being connected to the variable resistance element and the first upper-layer metal wire being connected to the upper plug, and at the same time, and the second via and the second upper-layer metal wire within the fourth inter-layer insulating layer in the circuit region, the second via being connected to the middle-layer metal wire and the second upper-layer metal wire being connected to the second via,
wherein the top face of the variable resistance element and the top face of the middle-layer metal wire are in a same plane, and
a thickness of the variable resistance element is different from a thickness of the middle-layer metal wire.

11. The method of manufacturing a non-volatile storage device according to claim 9, the method further comprising:
forming a first inter-layer insulating layer above the substrate;
concurrently forming the first lower-layer metal wire within the first inter-layer insulating layer in the storage region and the second lower-layer metal wire within the first inter-layer insulating layer in the circuit region;
forming a second inter-layer insulating layer above the first inter-layer insulating layer including the first lower-layer metal wire and the second lower-layer metal wire;
forming a lower plug within the second inter-layer insulating layer in the storage region, the lower plug being connected to the first lower-layer metal wire;
forming the variable resistance element in the storage region above the second inter-layer insulating layer including the lower plug, the variable resistance element being connected to the lower plug;
forming a third inter-layer insulating layer above the second inter-layer insulating layer including the variable resistance element;
forming the first via and the middle-layer metal wire within the second inter-layer insulating layer and the third inter-layer insulating layer in the circuit region, the first via being connected to the second lower-layer metal wire and the middle-layer metal wire being connected to the first via;
forming a fourth inter-layer insulating layer above the third inter-layer insulating layer including the variable resistance element and the middle-layer metal wire; and
concurrently forming an upper plug and the first upper-layer metal wire within the third inter-layer insulating layer and fourth inter-layer insulating layer in the storage region, the upper plug being connected to the variable resistance element and the first upper-layer metal wire being connected to the upper plug, and the second via and the second upper-layer metal wire within the fourth inter-layer insulating layer in the circuit region, the second via being connected to the middle-layer metal wire and the second upper-layer metal wire being connected to the second via, wherein the top face of the variable resistance element is lower than the top face of the middle-layer metal wire with respect to the surface of the substrate.

12. The method of manufacturing a non-volatile storage device according to claim 9, the method further comprising:
   forming a first inter-layer insulating layer above the substrate;
   concurrently forming the first lower-layer metal wire within the first inter-layer insulating layer in the storage region and the second lower-layer metal wire within the first inter-layer insulating layer in the circuit region;
   forming a second inter-layer insulating layer above the first inter-layer insulating layer including the first lower-layer metal wire and the second lower-layer metal wire;
   forming the first via and the middle-layer metal wire within the second inter-layer insulating layer in the circuit region, the first via being connected to the second lower-layer metal wire and the middle-layer metal wire being connected to the first via;
   forming a third inter-layer insulating layer above the second inter-layer insulating layer including the first via and the middle-layer metal wire;
   forming a lower plug within the second inter-layer insulating layer and the third inter-layer insulating layer in the storage region, the lower plug being connected to the first lower-layer metal wire;
   forming the variable resistance element in the storage region above the second inter-layer insulating layer including the lower plug, the variable resistance element being connected to the lower plug;
   forming a fourth inter-layer insulating layer above the third inter-layer insulating layer including the variable resistance element; and
   concurrently forming the first upper-layer metal wire within the fourth inter-layer insulating layer in the storage region, the first upper-layer metal wire being connected to the variable resistance element, and the second via and the second upper-layer metal wire within the third inter-layer insulating layer and the fourth inter-layer insulating layer in the circuit region, the second via being connected to the middle-layer metal wire and the second upper-layer metal wire being connected to the second via,
   wherein the bottom face of the variable resistance element is higher than the top face of the middle-layer metal wire with respect to the surface of the substrate.

* * * * *